United States Patent [19]

Miyaoka et al.

[11] Patent Number: 5,140,550

[45] Date of Patent: * Aug. 18, 1992

[54] SEMICONDUCTOR MEMORY DEVICE

[75] Inventors: SHUUICHI Miyaoka, Ohme; Masanori Odaka, Kodaira; Hiroshi Higuchi; Toshikazu Arai, both of Ohme, all of Japan

[73] Assignees: Hitachi Ltd., Tokyo, Japan; Hitachi Microcomputer Engineering Ltd., Tokyo, Japan; Akia Electronics Co., Ltd., Tokyo, Japan

[*] Notice: The portion of the term of this patent subsequent to Oct. 2, 2007 has been disclaimed.

[21] Appl. No.: 591,883

[22] Filed: Oct. 2, 1990

Related U.S. Application Data

[63] Continuation of Ser. No. 430,907, Oct. 31, 1989, Pat. No. 4,961,164, which is a continuation of Ser. No. 168,950, Mar. 16, 1988, abandoned.

[30] Foreign Application Priority Data

Mar. 16, 1987 [JP] Japan ................................ 62-58857

[51] Int. Cl.$^5$ .......................... G11C 7/00; G11C 8/00; G11C 11/409
[52] U.S. Cl. ..................... 365/177; 365/189.01; 365/189.09; 365/190; 365/63
[58] Field of Search ............. 365/51, 63, 177, 189.01, 365/189.09, 190, 230.01, 230.03, 230.04, 230.06; 307/530, 446, 468

[56] References Cited

U.S. PATENT DOCUMENTS

| | | | |
|---|---|---|---|
| 4,713,796 | 12/1987 | Ogive et al. | 365/177 X |
| 4,727,517 | 2/1988 | Ueno et al. | 365/177 X |
| 4,807,194 | 2/1989 | Yamada et al. | 365/51 X |
| 4,935,901 | 6/1990 | Sasaki et al. | 365/230.03 |
| 4,939,696 | 7/1990 | Katsuo et al. | 365/230.03 |
| 4,961,164 | 10/1990 | Miyaoka et al. | 365/177 |

Primary Examiner—Alyssa H. Bowler
Attorney, Agent, or Firm—Antonelli, Terry, Stout & Kraus

[57] ABSTRACT

A semiconductor memory device is provided which includes a plurality of memory arrays each including main word lines, sub word lines to which a plurality of memory cells are connected, and a decoder which selectively connects the sub word lines to the main word lines. The main word lines are relatively short, since they are isolated electrically between memory arrays, and their resistance can thus be relatively low. The main word lines are not directly connected with a plurality of memory cells, and this results in a smaller capacitance coupled to the main word lines than is customarily the case. Consequently, the semiconductor memory device can have an enhanced operating speed.

31 Claims, 13 Drawing Sheets

SEMICONDUCTOR MEMORY DEVICE

This is a continuation of application Ser. No. 430,907, filed Oct. 31, 1989, now U.S. Pat. No. 4,961,164, which is a continuation of application Ser. No. 168,950, filed Mar. 16, 1988, now abandoned.

BACKGROUND OF THE INVENTION

The present invention relates to a semiconductor memory device and to the technology useful for fabricating, for example, a bipolar CMOS static random access memory (which will be termed "bipolar CMOS RAM" hereinafter) consisting of bipolar transistors and CMOS circuits.

As a method of making a faster static RAM, the word line division system has been developed in which word lines constituting a memory array are arranged dividedly.

As shown in FIG. 13, a conventional static RAM based on the word line division system has its memory array made up of, for example, eight divisional memory arrays ARY1-ARY8 disposed on both sides of an X address decoder XDCR. The X address decoder XDCR includes decoding NOR gates NOG23-NOG25 of q in number having their input terminals supplied with complementary internal address signals ax0-axi (in this specification, an internal address signal, e.g., ax0, in phase with an external address signal, e.g., AX0, and an internal address signal, e.g., $\overline{ax0}$, in opposite phase with AX0 are termed ax0 comprehensively) in certain combinations. The decoding NOR gates provide their output signals as row selection signals to the divisional memory arrays ARY1-ARY8 over row selection signal lines (main word lines) MW1-MWq.

The divisional memory arrays ARY1-ARY8 each include n sets of complementary data lines D1, $\overline{D1}$-$\overline{Dn}$, Dn, divisional word lines SW1-SWq of q in number arranged orthogonally to these data lines and in parallel to the main word lines, and memory cells MC of q×n in number disposed at intersections of the word lines and complementary data lines. In each divisional memory array, the divisional word lines SW1-SWq are connected with the output terminals of corresponding AND gates AG1-AG3 or AG4-AG6 of q in number. Each AND gate has one input terminal connected with a corresponding row selection signal line MW1-MWq and another input terminal connected commonly with one of block selection signal lines B1-B8 corresponding to the array. Each divisional memory array has one of divisional word lines SW1-SWq selected when the corresponding row selection signal line is selected and the associated divisional memory array (ARY1-ARY8) is designated by the block selection signal line (B1-B8).

As described above, in a static RAM having divisional word lines, memory cells MCs are not connected directly to the row selection signal lines MW1-MWq, and therefore the load capacitance coupled with each row selection signal line is relatively small. Furthermore, each divisional word line (SW1-SWq) is coupled with only n memory cells MCs in a divisional memory array, and its load capacitance is also relatively small. The number of divided memory arrays, i.e., number of divisions of the memory array, is chosen so that the total load capacitance of the row selection signal lines and divisional word lines is minimal. In consequence, the load to the decoding NOR gates NOG23-NOG25 in the X address decoder XDCR and AND gates AG1-AG6 in the divisional memory arrays ARY1-ARY8 is reduced as the whole thereby to speed up the word line selecting operation.

The foregoing word line division system is described, for example, in publication DIGEST OF TECHNICAL PAPER, p.59, published in Feb., 1983 by International Solid-State Circuit Conference.

SUMMARY OF THE INVENTION

The inventors of the present invention have revealed the following major problems in the foregoing word line division system. As shown in FIG. 13, the row selection signal lines MW1-MWq are each arranged over all divisional memory arrays ARY1-ARY8 and connected with AND gates within the arrays. Namely, the row selection signal line is relatively long and, in addition, connected with many AND gates. Each row selection signal line is as long as a row selection signal line in case the word line division system is not adopted, and its distributed resistance and load capacitance have considerable values. As static RAM devices are made more capacious and their highly integrated circuit elements are made much smaller, the driveability for decoding logic gates and the like cannot be increased. Therefore, a row selection signal line, among MW1-MWq, to be made active does not have its rising slope improved significantly, and the word line selecting operation and the resulting access time of a static RAM device are not sped up as expected.

It is an object of the present invention to provide a semiconductor memory device which has a reduced access time.

Those and other objects and novel features of this invention will become more apparent from the following description in the specification taken in conjunction with the accompanying drawings.

Among the features of the invention disclosed in this specification, typical aspects are summarized as follows. A memory mat is divided into a plurality of sections, signals for selecting a divided mat are entered to a row selection circuit along with the address signal thereby to select a memory mat, and a row selection signal (main word line) in the memory mat is selected. A plurality of nearby divisional word lines are made correspondent to each row selection signal line so that they are made active selectively in accordance with a block row selection signal.

The above-mentioned scheme reduces the distributed resistance and load capacitance through the division of row selection signal lines (main word lines) and increases the latitude of the layout of the decoding logic gate circuits in the row selection decoder through the correspondence of divisional word lines to each row selection signal line. This allows an increased circuit area and improved driving ability. Therefore, the word line selecting operation and the resulting access operation of a semiconductor memory device such as a static RAM can be sped up.

DESCRIPTION OF THE PREFERRED EMBODIMENTS

Figure 11:
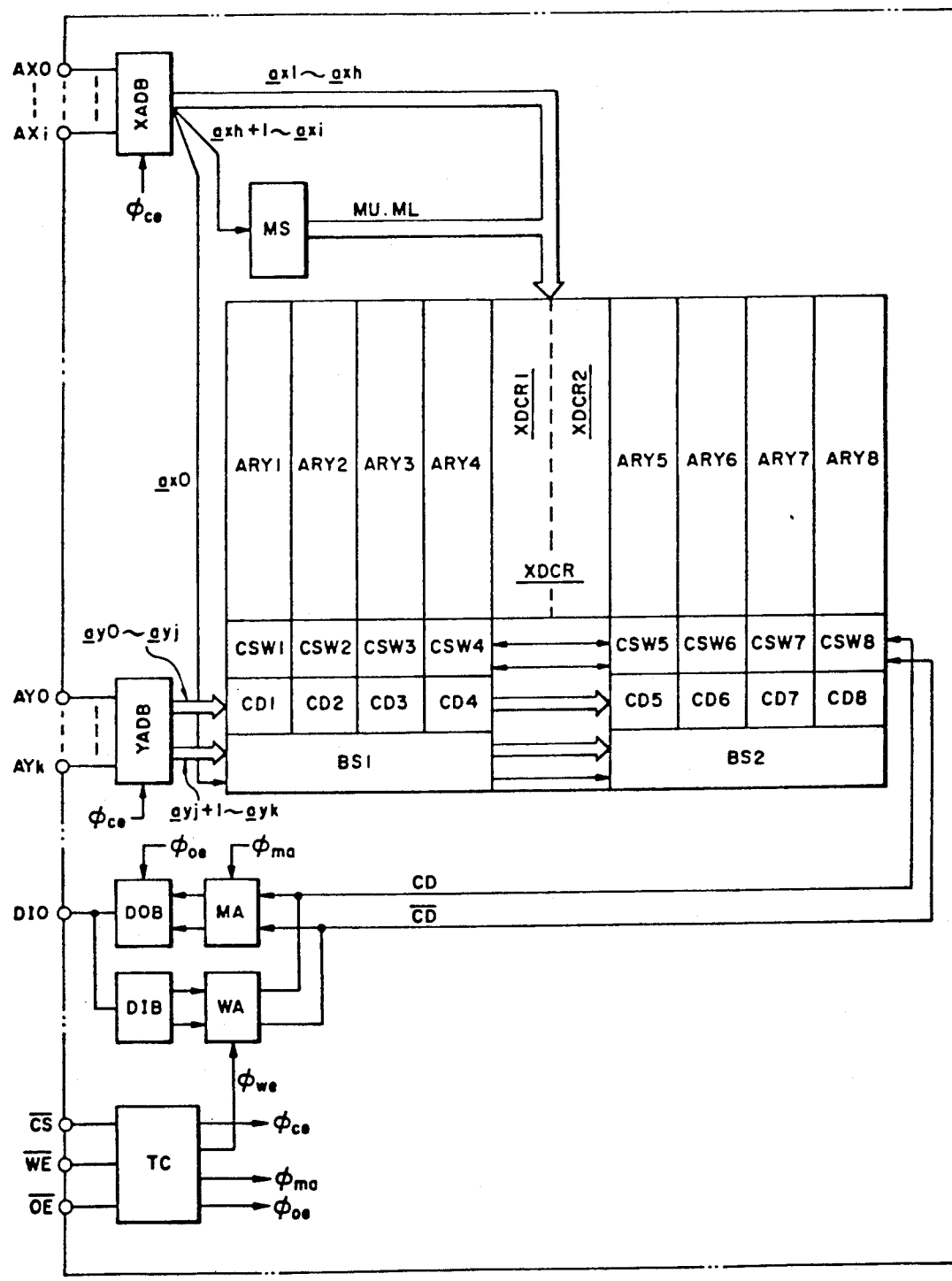
FIG. 11 is a block diagram showing an embodiment of the bipolar CMOS RAM incorporating memory arrays and peripheral circuits shown in FIG. 1.

FIG. 11 shows in block diagram form an embodiment of the bipolar CMOS RAM to which the present invention is applied. In the figure, circuit blocks enclosed by the dash-dot line are fabricated by known integrated circuit manufacturing technologies on a single semiconductor substrate such as monocrystalline silicon, although the circuit structure is not confined to this.

The bipolar CMOS RAM of this embodiment has its memory array peripheral circuits such as the address buffer and part of address decoder formed of bipolar transistors and CMOS (complementary MOS) transistors, for purposes of speeding up the operation. For the further enhancement of operating speed, this bipolar CMOS RAM adopts the divided word line system and takes other measures described hereinafter.

The bipolar CMOS RAM of this embodiment has its memory array constituted by eight divisional memory arrays ARY1–ARY8, although limitation is not intended. These memory arrays are disposed in groups of four arrays on both sides of an X address decoder (row selection circuit) XDCR. In this embodiment, the X address decoder XDCR is virtually formed of two X address decoders XDCR1 and XDCR2, with one X address decoder XDCR1 corresponding to four memory arrays ARY1–ARY4 located on its left side and with another X address decoder XDCR2 corresponding to four memory arrays ARY5–ARY8 located on its right side. The X address decoder XDCR1 is formed of NAND gates NAG1–NAG2 and another X address decoder XDCR2 is formed of NAND gates NAG3–NAG4, as will be appreciated from the later explanation on FIG. 1. The X address decoders XDCR1 and XDCR2 are made active selectively by the mat selection signals ML and MU, as will be explained later.

A block selection circuit BS1 is provided for the four divisional memory arrays ARY1–ARY4 located on the left of the X address decoder XDCR1, and a block selection circuit BS2 is provided for the four divisional memory arrays ARY5–ARY8 located on the right of the X address decoder XDCR2. Column switches CSW1–CSW8 and column address decoders CD1–CD8 are provided for the divisional memory arrays correspondingly. The column address decoders CD1–CD8 and block selection circuits BS1–BS2 in combination constitute a Y address decoder YDCR.

An X address buffer XADB is supplied with X address signals AX0–AXi via external terminals AX0–AXi and a timing signal φce from a timing control circuit TC which will be explained later. The timing signal φce is produced in response to the chip select signal CS supplied as a control signal, and it is brought to a logical high level when the bipolar CMOS RAM is chip-selected. The X address buffer XADB produces complementary internal address signals ax0–axi in response to the X address signals AX0–AXi and timing signal φce. Complementary internal address signals axh+1–axi are supplied to the mat selection circuit MS, which produces complementary mat selection signals MU and ML by decoding the complementary internal address signals axh+1–axi. The complementary mat selection signals MU and ML are supplied to the X address decoders XDCR1 and XDCR2. Complementary internal address signals ax1–axh are supplied to the X address decoder XDCR, and complementary internal address signal ax0 is supplied to the block selection circuits BS1 and BS2.

A Y address buffer YADB is supplied with Y address signals AY0–AYk via the external terminals AY0–AYk, although no limitation is intended, and the timing signal φce from the timing control circuit TC. The Y address buffer YADB produces complementary internal address signals ay0–ayk in response to the Y address signals AY0–AYk and timing signal φce. Complementary internal address signals ay0–ayj are supplied commonly to column address decoders CD1–CD8 in the Y address decoder YDCR, while complementary internal address signals ayj+1–ayk are supplied commonly to the block selection circuits BS1 and BS2.

Complementary common data lines CD·$\overline{CD}$ are connected with the input terminal of a main amplifier MA and also with the output terminal of a write amplifier WA. The main amplifier MA has its output terminal connected with the input terminal of a data output buffer DOB, and the input terminal of the write amplifier WA is connected with the output terminal of data input buffer DIB.

The main amplifier MA is activated in response to the timing signal φma supplied from the timing control circuit TC so as to amplify the complementary readout signal sent from a selected memory cell MC over the complementary common data lines CD·$\overline{CD}$. The amplified readout signal is delivered to the data output buffer DOB.

In read mode of the bipolar CMOS RAM, the data output buffer DOB is made active in response to the timing signal φoe supplied from the timing control circuit TC to convert the memory cell readout signal provided by the main amplifier MA to the ECL levels, and delivers it to the input/output terminal DIO by way of an open-emitter bipolar transistor. In unselected or write modes of the bipolar CMOS RAM, the output of the data output buffer DOB is brought to a high-impedance state after the timing signal φoe has been brought to a logical low level.

In the write mode of the bipolar CMOS RAM, the data input buffer DIB delivers the ECL-level write signal supplied from outside through the input/output terminal DIO to a write amplifier WA as a MOS-level complementary write signal. The write amplifier WA is made active in response to the write timing signal φwe supplied from the timing control circuit TC, and supplies a write current to the complementary common data lines CD·$\overline{CD}$ in response to the complementary write signal supplied via the data input buffer DIB. In unselected or read modes of the bipolar CMOS RAM, the output of the write amplifier WA is brought to a high-impedance state after the timing signal φwe has gone low. The timing control circuit TC produces various timing signals and internal control signals from the chip select signal $\overline{CS}$, write enable signal $\overline{WE}$ and output enable signal $\overline{OE}$ supplied from outside, and distributes these signals to the internal circuit blocks.

Figure 1:
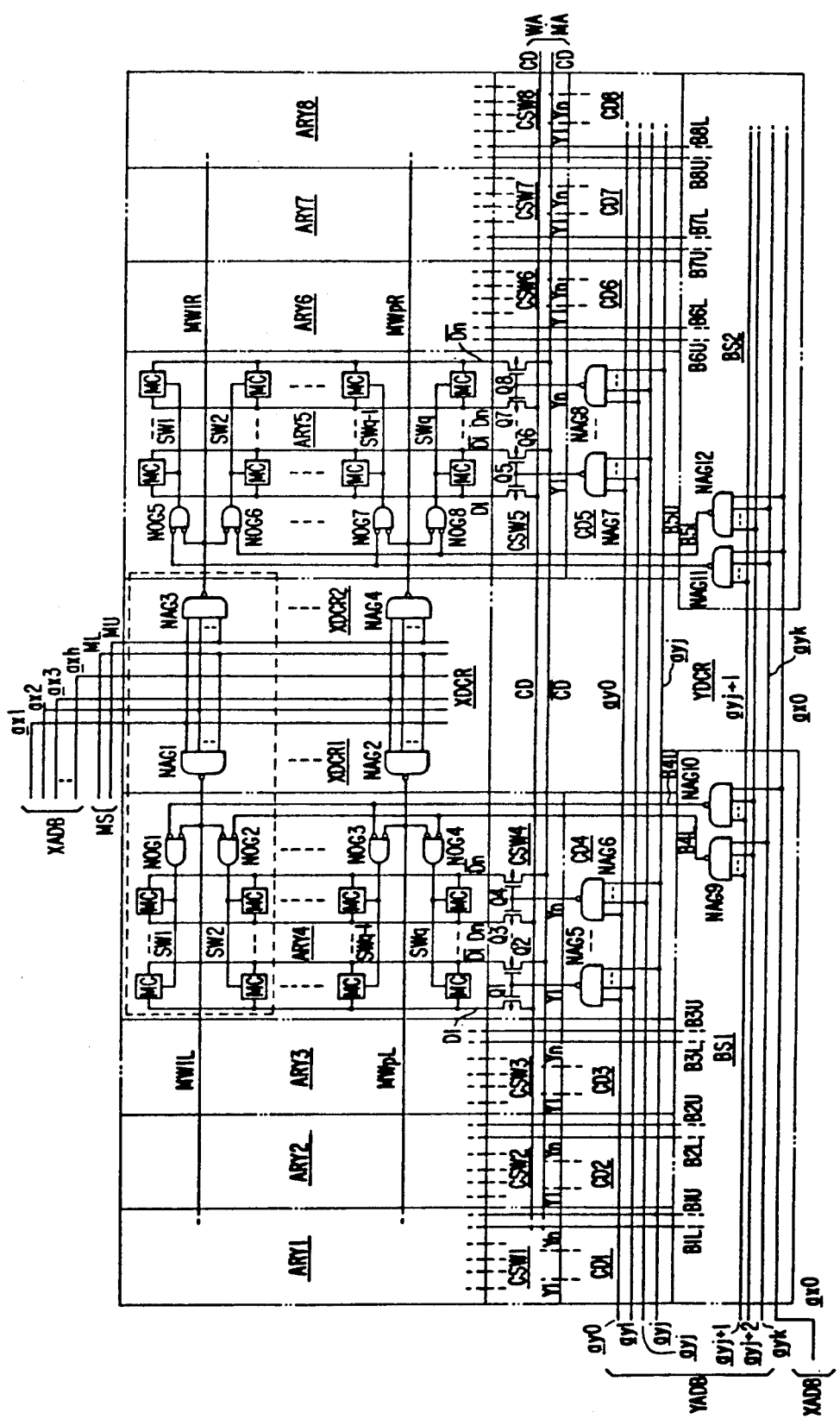
FIG. 1 is a schematic diagram showing an embodiment of the memory array and peripheral circuit of a bipolar CMOS RAM to which the present invention is applied.

FIG. 1 shows the circuit arrangement of the memory arrays and peripheral circuits in the bipolar CMOS RAM shown in FIG. 11. In the figure, MOS FETs with an arrow being appended to their channel (back gate) section are p-channel MOS FETs. The X address decoder XDCR is supplied with the complementary address signals ax1-axh from the X address buffer XADB and the complementary mat selection signals ML and MU from the mat selection circuit MS, although no limitation is intended. In correspondence to each combination of these complementary internal address signals and mat selection signals, two sets of decoding NAND gates such as NAG1-NAG4, to a total of 2×p pieces, are provided as a unit decoder. Unit decoding NAND gates NAG1-NAG2 constituting the X address decoder XDCR1 have output terminals connected with main word lines (row selection signal lines) MW1L-MWpL of p in number laid in parallel on the left of the X address decoder XDCR1, while unit decoding NAND gates NAG3-NAG4 constituting the X address decoder XDCR2 have output terminals connected with main word lines (row selection signal lines) MW1R-MWpR of p in number laid on the right of the X address decoder XDCR2. Namely, the bipolar CMOS RAM of this embodiment has its main word lines distributed to memory mats located on the right and left of the X address decoder XDCR (XDCR1 and XDCR2).

These main word lines MW1L-MWpL and MW1R-MWpR are all brought to a logical high level in an unselected mode of the bipolar CMOS RAM, and when this RAM is selected with a decoding NAND gate, e.g., NAG1, receiving all high-level input signals, that decoding NAND gate has its output signal brought to a logical low level selectively.

The divisional memory arrays ARY1-ARY8 have the same arrangement, each including q sub word lines (divided word lines) SW1-SWq, n sets of complementary data lines D1·$\overline{D1}$—Dn·$\overline{Dn}$, and q-by-n memory cells MCs disposed at the intersections of the word lines and complementary data lines. In each divisional memory array, the sub word lines SW1-SWq are paired, and the pairs are made to correspond to the order of the main word lines MW1L-MWpL or MW1R-MWpR.

Figure 8:
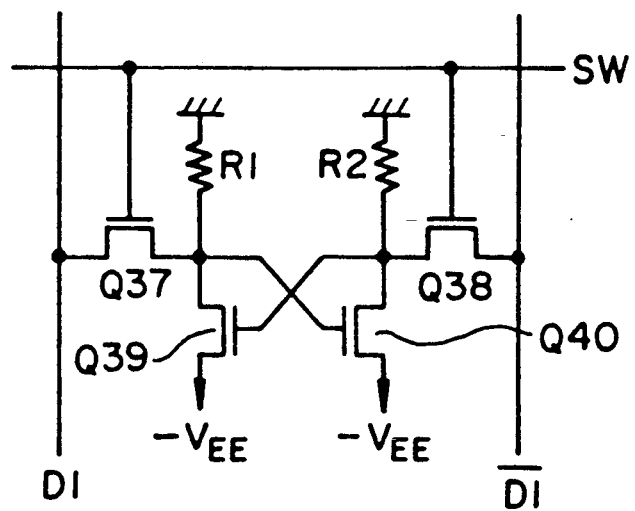
FIG. 8 is a schematic diagram showing a specific embodiment of the memory cell in the bipolar CMOS RAM.

Each memory cell MC includes as a basic arrangement two sets of inverters made up of n-channel MOS FETs Q39-Q40 and high load resistors R1-R2 as shown in FIG. 8, although no limitation is intended. The inverter pair constitutes a flip-flop through the cross connection of the input and output terminals, and functions as a memory element of the bipolar CMOS RAM. The flip-flop has two input-output nodes each connected with corresponding complementary data lines (D1·$\overline{D1}$—Dn·$\overline{Dn}$) through two n-channel transfer gate MOS FETs Q37-Q38, which have gates connected commonly to the corresponding sub word lines SW1-SWq. Namely, in each of the divisional memory arrays ARY1-ARY8, memory cells disposed on the same row have input-output nodes connected through corresponding transfer gate n-channel MOS FETs Q37-Q38 to the corresponding complementary data lines D1·$\overline{D1}$—Dn·$\overline{Dn}$, with the gates of the transfer gate MOS FETs being connected commonly with a corresponding sub word line (SW1-SWq).

The sub word lines SW1-SWq constituting the divisional memory arrays ARY1-ARY8 are divided in pairs, with each pair being made correspondent in order to the main word lines MW1L-MWpL or MW1R-MWpR. Accordingly, the number of sub word lines q in each divisional memory array is: q=2×p.

Each pair of sub word lines are laid contiguously above and below the respective main word line, although no limitation is intended. Each sub word line (SW1-SWq) is connected to the output terminal of the NOR gate (divided word line selection circuit) provided correspondingly. The NOR gate has one input terminal connected with a corresponding main word line (MW1L-MWpL or MW1R-MWpR) and another input terminal connected with a corresponding block selection signal line (B1U-B1L through B8U-B8L). The block selection signal lines are made active selectively by the block selection circuits BS1 or BS2. The main word lines and block selection signal lines are logically high when unselected, or logically low when selected.

In the divisional memory array ARY1-ARY8, the sub word lines laid above the main word lines MW1L-MWpL or MW1R-MWpR are brought to a high level selectively for selection when corresponding ones of main word lines and block selection signal lines B1U-B8U are low. Similarly, sub word lines laid below the main word lines MW1L-MWpL or MW1R-MWpR are brought to a high level selectively for selection when corresponding ones of main word lines and block selection signal lines B1L-B8L are low. A specific circuit arrangement and its operation of the memory array will be described in detail later.

The complementary data lines D1·$\overline{D1}$—Dn·$\overline{Dn}$ in the divisional memory arrays ARY1-ARY8 are connected selectively by corresponding switching MOS FET pairs in corresponding column switches CSW1-CSW8 to the complementary common data lines CD·$\overline{CD}$. The pairs of switching MOS FETs have their gates connected together and supplied with corresponding data line select signals Y1-Yn from corresponding column address decoders CD1-CD8.

The Y address decoder YDCR includes eight column address decoders CD1-CD8 provided in correspondence to the divisional memory arrays ARY1-ARY8 and two block selection circuits BS1 and BS2 provided in correspondence to divisional memory arrays ARY1-ARY4 and ARY5-ARY8. The column address decoders CD1-CD8 are supplied commonly with j+1 bit complementary internal address signals ay0-ayj from the Y address buffer YDB. The block selection circuits BS1 and BS2 are supplied with complementary internal address signals ayj+1-ayk from the Y address buffer YADB and a complementary internal address signal ax0 from the X address buffer XADB.

The column address decoders CD1-CD8 in the Y address decoder YDCR decode the complementary internal address signals ay0-ayj and selectively produce data line select signals Y1-Yn for selecting complementary data lines D1·D1̄ – Dn·D̄n of corresponding divisional memory arrays ARY1-ARY8. The data line select signals Y1-Yn are supplied to the gates of corresponding switching MOF FET pairs of corresponding column switches CSW1-CSW8. The block selection circuits BS1-BS2 in the Y address decoder YDCR decode the complementary internal address signals ayj+1-ayk and ax0 to produce selectively block select signals B1U-B8U or B1L-B8L. These block select signals are supplied commonly to another input terminal of the NOR gates NOG1-NOG8 provided in correspondence to the divided word lines SW1-SWq for the corresponding divisional memory arrays ARY1-ARY8.

As mentioned previously, the X address decoder (row selection circuit) XDCR1 includes decoding NAND gates NAG1-NAG2 of p in number provided in correspondence to the divisional memory arrays ARY1-ARY4 located on its left side, although no limitation is intended. The X address decoder XDCR2 includes NAND gates NAG1-NAG4 of p in number provided in correspondence to the divisional memory arrays ARY5-ARY8 located on its right side. These NAND gates NAG1-NAG4 also function as drivers. Supplied to the input terminals of the NAND gates NAG1-NAG2 are complementary internal address signals ax1-axh from the X address buffer XADB and complementary mat select signal ML from the mat selection circuit MS in certain combinations. The NAND gates NAG3-NAG4 have their input terminals connected commonly to corresponding input terminals of corresponding NAND gates NAG1-NAG2, with a difference being that the NAG3-NAG4 are supplied with the mat select signal MU in place of the ML supplied to the NAG1-NAG2. Namely, the NAND gates NAG1 and NAG3 and the gates NAG2 and NAG4 receive complementary internal address signals ax1-axh in the same combinations, and the gates NAG1 and NAG2 and the gates NAG3 and NAG4 are supplied with the mat select signals ML and MU, respectively. Consequently, either the gates NAG1-NAG2 or NAG3-NAG4 are selected in accordance with the mat select signals ML and MU, and a NAND gate in the selected group NAG1-NAG2 (or NAG3-NAG4), with its input internal address signals being all high, produces a low select signal, while remaining NAND gates produce high unselect signals.

The decoding NAND gates NAG1 and NAG3 or gates NAG2 and NAG4 in the X address decoder XDCR have their output signals made all high when the bipolar CMOS RAM is unselected, and are selectively brought to a low level when the bipolar CMOS RAM is selected and the complementary internal address signals ax1-axh and complementary internal mat select signals ML-MU are in a relevant combination. Namely, two of 2×p main word lines in the right and left mats are selected by the complementary internal address signals ax1-axh, and one of the two main word lines is selected by the mat select signals. The NAND gates NAG1-NAG2 have their output terminals connected with the main word lines (row selection signal lines) MW1L-MWpL, respectively, and connected commonly with one of the input terminals of NOR gates (divisional word line selection circuits) NOG1-NOG4 in the divisional memory arrays ARY1-ARY4. The NAND gates NAG3-NAG4 have their output terminals connected with the main word lines MW1R-MWpR, respectively, and are connected commonly with one input terminals of NOR gates (divisional word line selection circuits) NOG1-NOG8 in the divisional memory arrays ARY5-ARY8.

The divisional memory arrays ARY1-ARY8 include sub word lines (divided word lines) SW1-SWq of q in number laid in parallel to the horizontal direction in FIG. 1, n sets of complementary data lines D1·D1̄ – Dn·D̄n laid in parallel orthogonally to the sub word lines, and q-by-n memory cells MCs disposed on the intersections of the sub word lines and complementary data lines, as illustrated by the divisional memory arrays ARY4 and ARY5. As mentioned previously, q memory cells disposed on the same row of each divisional memory array have their input-output nodes connected through corresponding two transfer gating MOS FETs with corresponding complementary data lines D1·D1̄ – Dn·D̄n. Transfer gating MOS FETs of n memory cells MCs disposed on the same row of each divisional memory array are connected commonly with corresponding sub word lines SW1-SWq.

The sub word lines SW1-SWq of the divisional memory arrays ARY1-ARY8 are paired and laid contiguously above and below the corresponding main word lines MW1-MWp. The sub word lines SW1-SWq are connected with the output terminals of corresponding NOR gates NOG1(NOG5)-NOG4(NOG8). One input terminal from each of two NOR gates in each sub word line group are connected commonly with corresponding main word lines MW1-MWp. Other input terminals of NOR gates corresponding to the sub word lines located above the main word lines are connected with block select signal lines of one corresponding set B1U-B8U, respectively. Similarly, other input terminals of NOR gates corresponding to the sub word lines located below the main word lines are connected with block select signal lines of another set B1L-B8L, respectively. These block select signal lines B1U-B8U and B1L-B8L are connected with the output terminals of corresponding decoding NAND gates in the block selection circuit BS1 or BS2, and are made active selectively.

The block selection circuits BS1 and BS2 includes eight decoding NAND gates provided in correspondence to the divisional memory arrays ARY1-ARY4 or ARY5-ARY8, as illustrated by the NAND gates NAG9, NAG10, NAG11 and NAG12 in FIG. 1, although no limitation is intended. These decoding NAND gates have input terminals receiving the complementary internal address signals ayj+1-ayk and complementary internal address signal ax0 from the Y address buffer YADB and X address buffer XADB in certain combinations. Accordingly, divisional memory arrays ARY1-ARY8 are selected in accordance with the complementary internal address signals ayj+1-ayk, and sub word lines laid above or below the main word lines are selected in accordance with the complementary internal address signal $\underline{a}x0$, although no limitation is intended.

The decoding NAND gates NAG9-NAG12, etc. in the block selection circuits BS1 and BS2 have their output signals, i.e., block select signal lines B1U-B8U and B1L-B8L, all brought to a high level when the bipolar CMOS RAM is unselected, and they are selectively made low when corresponding complementary internal address signals ayj+1-ayk and complementary internal address signal $\overline{a}x0$ are all high.

The NOR gates $\overline{NOG1}$-NOG8 in the divisional memory arrays ARY1-ARY8 have output signals all brought to a low level when the bipolar CMOS RAM is unselected, and their output signals go high when corresponding main word lines are low and, at the same time, corresponding block, select signal line is low. Namely, the sub word lines SW1-SWq of the divisional memory arrays are brought to a high selected state by corresponding NOR gates, i.e., divisional word line selection circuits, when corresponding main word lines and block select signal lines are both in a low selected state.

The complementary data lines D1·$\overline{D1}$—Dn·$\overline{Dn}$ for the divisional memory arrays ARY1-ARY8 are connected selectively to the complementary common data lines CD·$\overline{CD}$ through corresponding p-channel switching MOS FET pairs Q1·Q2—Q3·Q4 (Q5·Q6—Q7·Q8) in corresponding column switches CSW1-CSW8. The switching MOS FET pairs have their gates each connected together and supplied with corresponding data line select signals Y1-Yn from corresponding column address decoders CD1-CD8. The column address decoders CD1-CD8 include decoding NAND gates of n in number provided in correspondence to the switching MOS FET pairs in corresponding column switches CSW1-CSW8, as illustrated by the NAND gates NAG-5-NAG6 and NAG7-NAG8 in FIG. 1.

The NAND gates receive at their input terminals complementary internal address signals ay0-ayj in respective combinations supplied from the $\overline{Y}$ address buffer YADB. When the bipolar CMOS RAM is unselected, the output signals of these NAND gates, i.e., data line select signals Y1-Yn are all brought to a high level, and brought selectively to a low level when the complementary internal address signals ay0-ayj are in respective combinations. Namely, the internal address signals in certain combinations are supplied to the input terminals of the NAND gates so that a pair of data lines are connected to the complementary common data lines CD·$\overline{CD}$ depending on the combination of the complementary internal address signals ay0-ayj. This causes one of the column address decoders CD1-CD8 to have the data line select signals Y1-Yn selectively made low. Consequently, a switching MOS FET pair corresponding to column switches CSW1-CSW8 corresponding to the NAND gates which constitute a low-level data line select signal is turned on. Consequently, the complementary data line corresponding to the divisional memory array ARY1-ARY8 corresponding to the switching MOS FET pair is connected to the complementary common data lines CD·$\overline{CD}$, and stored data is transacted between the memory cell MC connected selectively to the complementary data lines by the selecting operation for the main word lines and sub word lines and the main amplifier MA or write amplifier WA.

Figure 9:
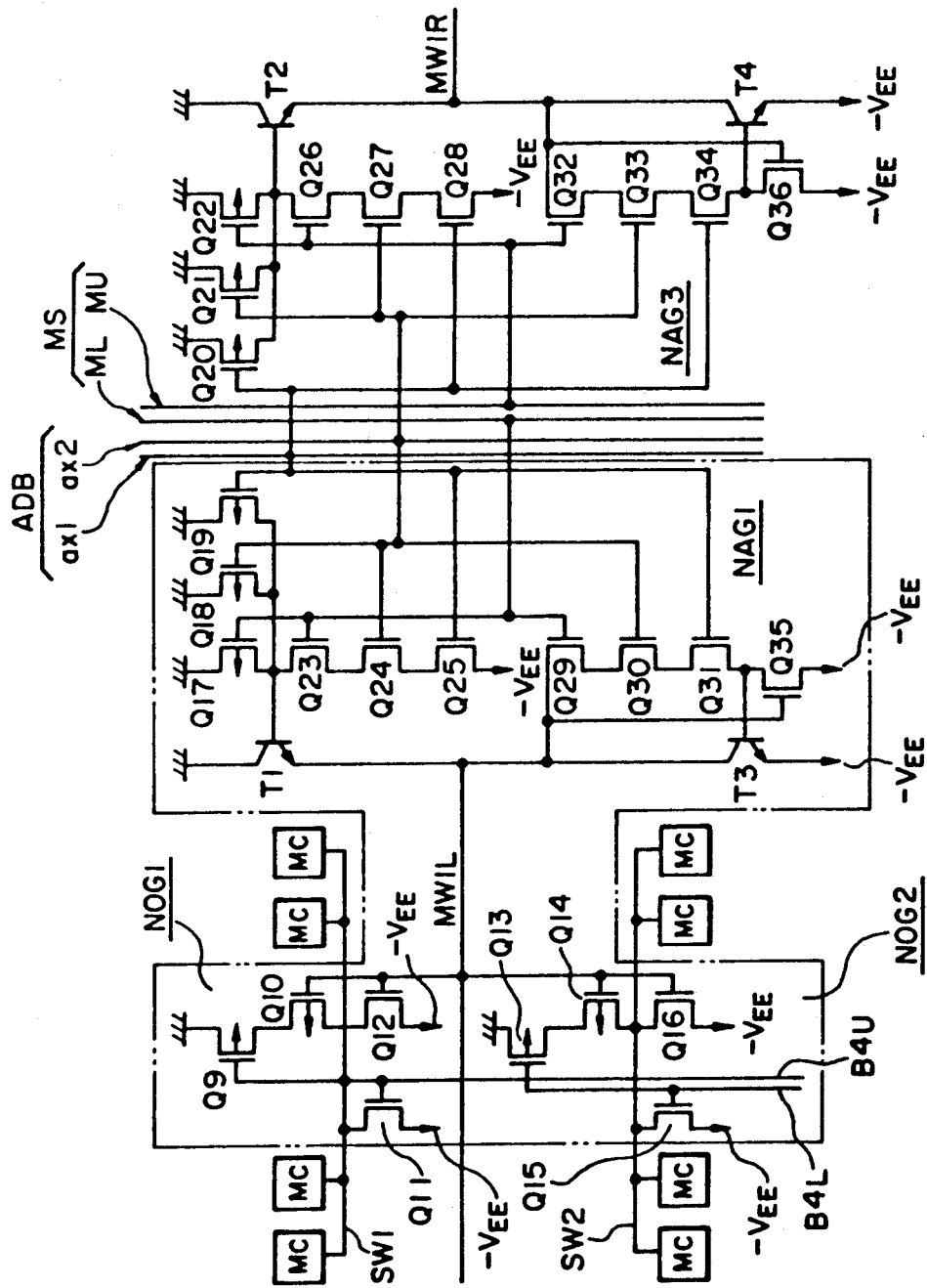
FIG. 9 is a schematic diagram showing an embodiment of the decoder section enclosed in the dashed-line block in FIG. 1.

FIG. 9 shows a specific embodiment of the circuit portion enclosed by the dashed line in FIG. 1. In the figure, p-channel MOS FETs are shown with an arrow appended at their channel section so that they are distinguished from n-channel MOS FETs. In this embodiment, MOS FETs Q17-Q19, Q23-Q25, Q29-Q31, Q35, and npn bipolar transistors T1-T2 in combination constitute the NAND gate (unit decoder) NAG1 shown in FIG. 1. The bipolar transistor T1 is to drive the main word line MW1L to the ground level, and it is driven by the output signal of a 3-input NAND gate made up of the MOS FETs Q17-Q19 and Q23-Q25. The bipolar transistor T3 is driven by the circuit made up of the MOS FETs Q29-Q31 and Q35 to drive the main word line MW1L to the $-V_{EE}$ level. In other words, the purpose of T1 is to precharge the main word line MW1L, and the purpose of T3 is to discharge the MW1L. Similarly, MOS FETs Q20-Q22, Q26-Q28, Q32-Q34, Q36, and npn bipolar transistors T2 and T4 in combination constitute the NAND gate NAG3 shown in FIG. 1.

These 3-input NAND gates are each supplied commonly with the complementary address signals ax1 and ax2 from the X address buffer XADB, and further supplied at their remaining input terminal with the complementary mat select signals ML and MU from the mat selection circuit separately. With the complementary address signals ax1-ax2 and complementary mat select signal ML being high, the bipolar output transistor T3 becomes conductive and the complementary bipolar transistor T1 is cut off, causing the main word line MW1L to become a low-level selected state. At this time, a low complementary mat select signal MU causes the bipolar output transistor T2 to become conductive and bipolar output transistor T4 to be cut off, resulting in a low-level unselected state of the main word line MW1R. Conversely, low complementary mat select signals ML and high MU cause the main word line MW1L to become unselected and main word line MW1R to become selected. When one or both of the complementary address signals ax1-ax2 are low, the main word lines MW1L and MW1R are both brought to a high-level unselected state regardless of the logical level of the complementary mat select signals ML and MU.

The NOR gates NOG1 and NOG2 constituting the divided word line selection circuit are made up of MOS FETs Q9-Q12 and Q13-Q16, respectively. In this embodiment, the divided word line selection circuit has its output terminal connected at virtually the middle of the sub word lines SW1-SW2. This enables memory cells MCs located at both extremes of a sub word line (e.g. SW1) to be selected at virtually the same time, and this is effective for the speed-up of the device. Since the sub word lines are shorter than the main word lines, the sub word line selection circuit is formed of a CMOS circuit in this embodiment, and this prevents the area from increasing significantly. However, the sub word line selection circuit may also be formed of bipolar transistors and CMOS circuits.

The NOR gates NOG1 and NOG2 have one of input terminals connected commonly to the main word line MW1L. Another input terminal of NOG1 is supplied with a block signal B4U from the block selection circuit BS1, and another input terminal of NOG2 is supplied with a block signal B4L from the block selection circuit BS1. With the main word line MW1L being made low and the block signal B4U being made low, the output terminal of the NOR gate NOG1 goes high, and then the sub word line SW1 connected at the output terminal of the NOR gate NOG1 goes high. Consequently, the memory cell connected to the sub word line SW1 is selected. At this time, the block signal B4L is brought to a high level (ground level), the output terminal of the NOR gate NOG2 becomes low ($-V_{EE}$), and the memory cell MC connected to the sub word line SW2 is unselected.

Conversely, when the block signal B4U is high and block signal B4L is low, the memory cell MC connected to the sub word line SW1 is unselected, and the memory cell MC connected to the sub word line SW2 is selected. With the main word line MW1L being high, the sub word lines SW1-SW2 are made low regardless of the levels of block signals B4L and B4U, and the memory cell MC connected thereto is unselected. The same is true when the block select signals B4L and B4U are both high.

In this embodiment, the NAND gates forming the block selection circuits BS1 and BS2 are arranged identically to the NAND gate NAG1, although no limitation is intended. Namely, they are formed of bipolar transistors and CMOS circuits.

Figure 10:
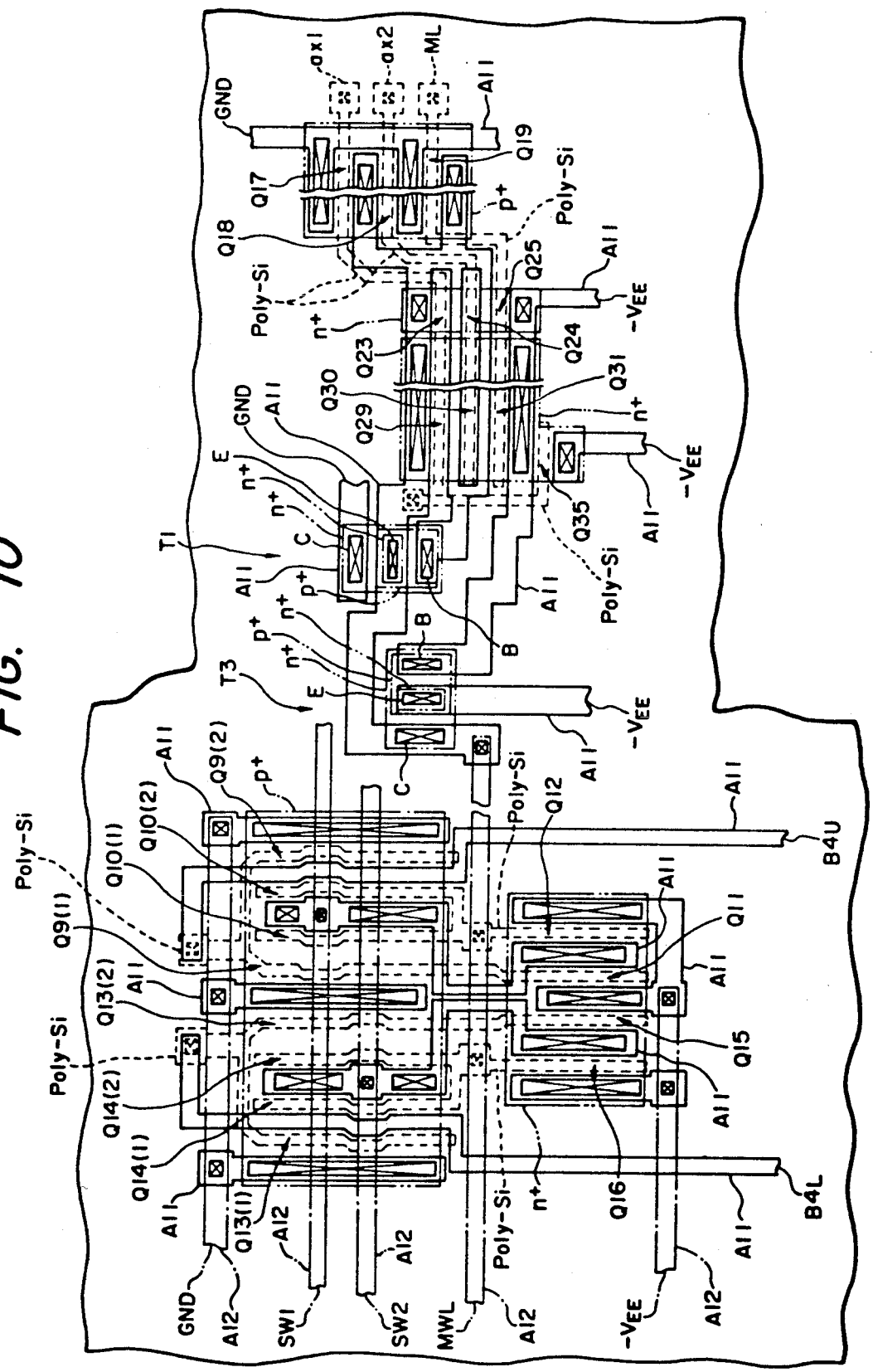
FIG. 10 is a layout diagram embodying the circuit arrangement enclosed in the dashed-line block in FIG. 9.

FIG. 10 shows the layout of the circuit portion enclosed by the dashed line in FIG. 9. The same reference symbols are used for corresponding portions in these figures. In FIG. 10, indicated by ax1, ax2 and ML are wirings for supplying the signals ax1, ax2 and ML shown in FIG. 9, and $-V_{EE}$ and GND are the $-V_{EE}$ voltage level and ground level shown in FIG. 9. Similarly, B4L and B4U are wirings for supplying the block signals B4L and B4U shown in FIG. 9.

In FIG. 10, a region enclosed by the dashed line is a polysilicon layer, a region enclosed by the solid line is a first aluminum layer, a region enclosed by the dash-dot line is a second aluminum layer, and a region enclosed by the 2-dot-dash line is a diffusion region. As will be appreciated from the figure, the complementary internal address signals ax1-ax2 from the X address buffer XADB and mat select signal ML from the mat selection circuit are supplied through a polysilicon layer to the gate electrodes of MOS FETs Q17-Q19, Q23-Q25 and Q29-Q31. The p-channel MOS FETs Q17-Q19 are connected in parallel between the ground GND and the drain of the n-channel MOS FET Q23, and the drains of the p-channel MOS FETs Q17-Q19 are conducted through a first aluminum layer Al1 to the ground GND. The sources of the p-channel MOS FETs Q17-Q19 are connected with the base B of the bipolar output transistor T1 and the drain of the n-channel MOS FET Q23 through the first aluminum layer Al1. The p-channel MOS FETs Q17-Q19 have their source and drain electrodes made of p+ type diffusion layer. The n-channel MOS FETs Q23-Q25 are connected in series between the base B of the bipolar output transistor T1 and the voltage source $-V_{EE}$, with the source of Q25 being connected through the first aluminum layer Al1 to the voltage source $-V_{EE}$. The n-channel MOS FETs Q23-Q25 have their source and drain electrodes made of n+ type diffusion layer. The n-channel MOS FETs Q29-Q31 are connected in series between the gate of n-channel MOS FET Q35 and drain of n-channel MOS FET Q35. The drain of the n-channel MOS FET Q29 is connected through the first aluminum layer Al1 to the emitter E of the bipolar output transistor T1, and further connected by way of a throughhole and polysilicon layer Poly-Si to the base of the n-channel MOS FET Q35. The source of the n-channel MOS FET Q34 is connected to the drain of the n-channel MOS FET Q35, and further connected through the first aluminum layer Al1 to the base B of the bipolar output transistor T3. The n-channel MOS FETs have their sources connected through the first aluminum layer Al1 to the voltage source $-V_{EE}$. The source and drain electrodes of the n-channel MOS FETs Q29-Q31 and Q35 are made of n+ type diffusion layer.

The bipolar output transistor T1 has its collector C connected through the first aluminum layer Al1 to the ground GND, and its emitter E connected through the first aluminum layer Al1 to the drain of the n-channel MOS FET Q29 and gate of n-channel MOS FET Q35 and further connected through the second aluminum layer Al2 to the main word line MW1L. The bipolar output transistor T3 has its emitter E connected to the voltage source $-V_{CC}$. The emitter and collector electrodes of the bipolar output transistors T1 and T3 are made of n+ type diffusion layer and their base electrodes are made of p+ type diffusion layer.

The p-channel MOS FET Q9 shown in FIG. 9 consists of two sections Q9(1) and Q9(2) connected in parallel in FIG. 10. Similarly, the p-channel MOS FETs Q10, Q13 and Q14 in FIG. 9 are each formed in two sections Q10(1)-Q10(2), Q13(1)-Q13(2) and Q14(1)-Q14(2) in FIG. 10. The main word line MW1L made of the second aluminum layer Al2 is connected by way of a throughhole and polysilicon layer Poly-Si to the gate electrodes of p-channel MOS FETs Q10(1), Q10(2), Q14(1) and Q14(2), and to the gate electrodes of n-channel MOS FETs Q12 and Q16. The block signal lines B4U and B4L formed of the first aluminum layer Al1 are connected by way of a throughhole and Poly-Si to the gate electrodes of the p-channel MOS FETs Q9(1) and Q9(2) and n-channel MOS FET Q11. The block signal line B4L is connected to the gate electrodes of the p-channel MOS FETs Q13(1) and Q13(2) and n-channel MOS FET Q15. The p-channel MOS FETs Q9(1) and Q9(2) have their drains connected through the first aluminum layer Al1, throughhole and the second aluminum layer Al2 to the ground GND, and their sources connected through the first aluminum layer Al1 to the drains of the n-channel MOS FETs Q11 and Q12 and further connected through a throughhole to the sub word line SW1 formed of the second aluminum layer Al2. The drains of the n-channel MOS FETs Q11 and Q12 are connected through the first aluminum layer Al1 and a throughhole to the second aluminum layer Al2, by which these electrodes are connected to the voltage source $-V_{EE}$. The drains of the p-channel MOS FETs Q13(1) and Q13(2) are connected through the first aluminum layer Al1, throughhole and the second aluminum layer Al2 to the ground GND. The sources of the p-channel MOS FETs Q14(1) and Q14(2) are connected through the first aluminum layer Al1 to the drains of the p-channel MOS FETs Q15 and Q16, and by way of a throughhole to the sub word lines SW2 formed of the second aluminum layer Al2. The p-channel MOS FETs Q9(1), Q9(2), Q10(1), Q10(2), Q13(1), Q13(2), Q14(1) and Q14(2) have their source and drain electrodes formed of p+ type diffusion layer, and the n-channel MOS FETs Q11, Q12, Q15 and Q16 have their source and drain electrodes formed of n+ type diffusion layer.

According to this embodiment, as will be appreciated from FIGS. 9 and 10, a main word line is alloted to two sub word lines running in parallel. This arrangement reduces the number of unit address decoders needed to select a specific one of main word lines, and the latitude of the layout is enhanced. It also allows increased dimensions of the bipolar output transistors T1, T3, etc., thereby increasing their word line driving ability. In addition, the sub word line selection circuit formed of a 2-input gate circuit enables the word lines to be laid out with a smaller spacing between adjacent lines.

As described above, the bipolar CMOS RAM of this embodiment includes an X address decoder XDCR including 2-by-n decoding NAND gates (unit decoders) provided in correspondence to each combination of the complementary internal address signals ax1-axh and complementary mat select signals $\overline{ML}$ and $\overline{MU}$, and a memory array arranged dividedly in 4-unit groups on both sides of the X address decoder XDCR. Connected to these divisional memory arrays are p main word lines laid in parallel by one another and connected with p unit decoders provided in correspondence to the memory arrays. In each divisional memory array, 2-by-n divided word lines are laid in parallel above and below the corresponding main word lines. These divided word lines are made active selectively by the block select signal lines, and a selected word line (sub word line) is connected to the main word line corresponding to it. Accordingly, the length of each divided word line and the number of memory cells connected to each word line are reduced to ¼ of the case the word line division system is not used, whereby the distributed resistance and load capacitance on the sub word lines can be reduced significantly.

In this embodiment, a mat is divided into two major sections on the right and left of the X address decoder XDCR. Correspondingly, the main word lines are also divided on both sides of the X address decoder XDCR. This results in a shorter main word lines, with their load capacitance being reduced to about half the case of the conventional word line division system. Two divided word lines are laid above and below each main word line, and this arrangement increases the latitude of layout for the NAND gates (unit decoders) which constitute the X address decoder XDCR. This allows increased dimensions for the unit decoder elements, and their driving ability is enhanced. In consequence, the bipolar CMOS RAM of this embodiment is improved in the speed of word line selecting operation and thus in the reduction of its access time.

Figure 4:
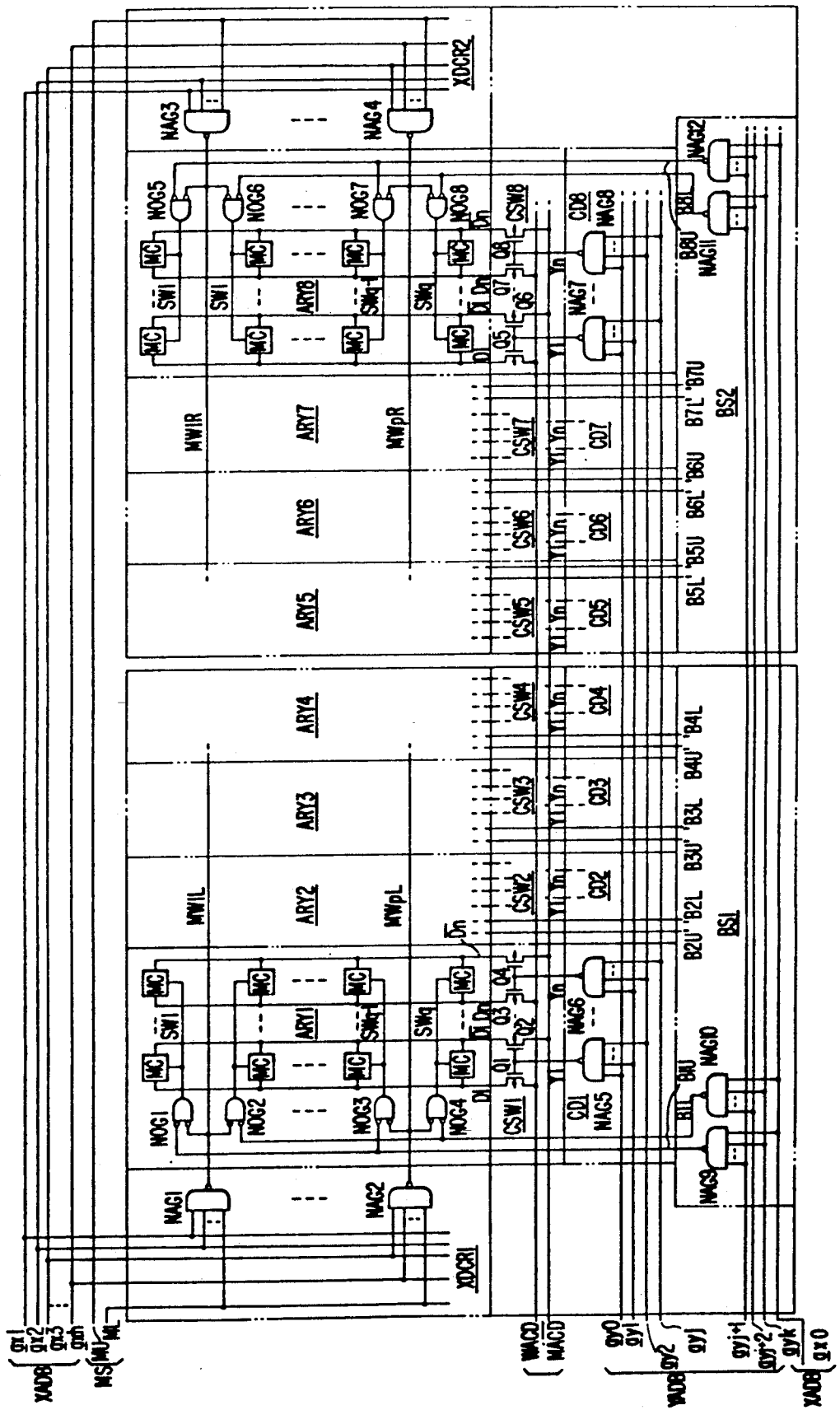
FIG. 4 is a schematic diagram showing the fourth embodiment of the memory array and peripheral circuit of the bipolar CMOS RAM to which the present invention is applied.

FIG. 4 shows another embodiment of this invention. This bipolar CMOS RAM has virtually the same circuit arrangement as the RAM shown in FIG. 1, and the following describes the outline and differences from the former embodiment. The X address decoders XDCR1 and XDCR2 include unit decoders NAG1-NAG2 and NAG3-NAG4, respectively, in correspondence to the combinations of the complementary internal address signals ax1-axh and complementary mat select signals $\overline{MU}$ and $\overline{ML}$. These unit decoders have their output terminals connected to corresponding main word lines MW1L-MWpL and MW1R-MWpR as shown, so that a main word line is selected in accordance with the internal address signals and mat select signals. The selected main word line is connected in each divisional memory array to a divided word line through a NOR gate which constitutes a sub word line selection circuit, and the memory cell connected to the selected sub word line is selected.

This embodiment differs from the bipolar CMOS RAM shown in FIG. 1 in the location of the X address decoders XDCR1 and XDCR2. Whereas in the preceding embodiment of FIG. 1 the memory array is divided into two on both sides of the X address decoder, the new embodiment has the X address decoders XDCR1 and XDCR2 disposed at both ends of memory arrays ARY1-ARY8. The main word lines MW1L-MWpL are formed above the memory arrays ARY1-ARY4 and the MW1R-MWpR above the ARY5-ARY8 also in this embodiment, with the MW1L-MWpL and MW1R-MWpR being isolated electrically. As this embodiment shows, the X address decoder may be laid in any place provided that the memory array is divided.

Figure 12:
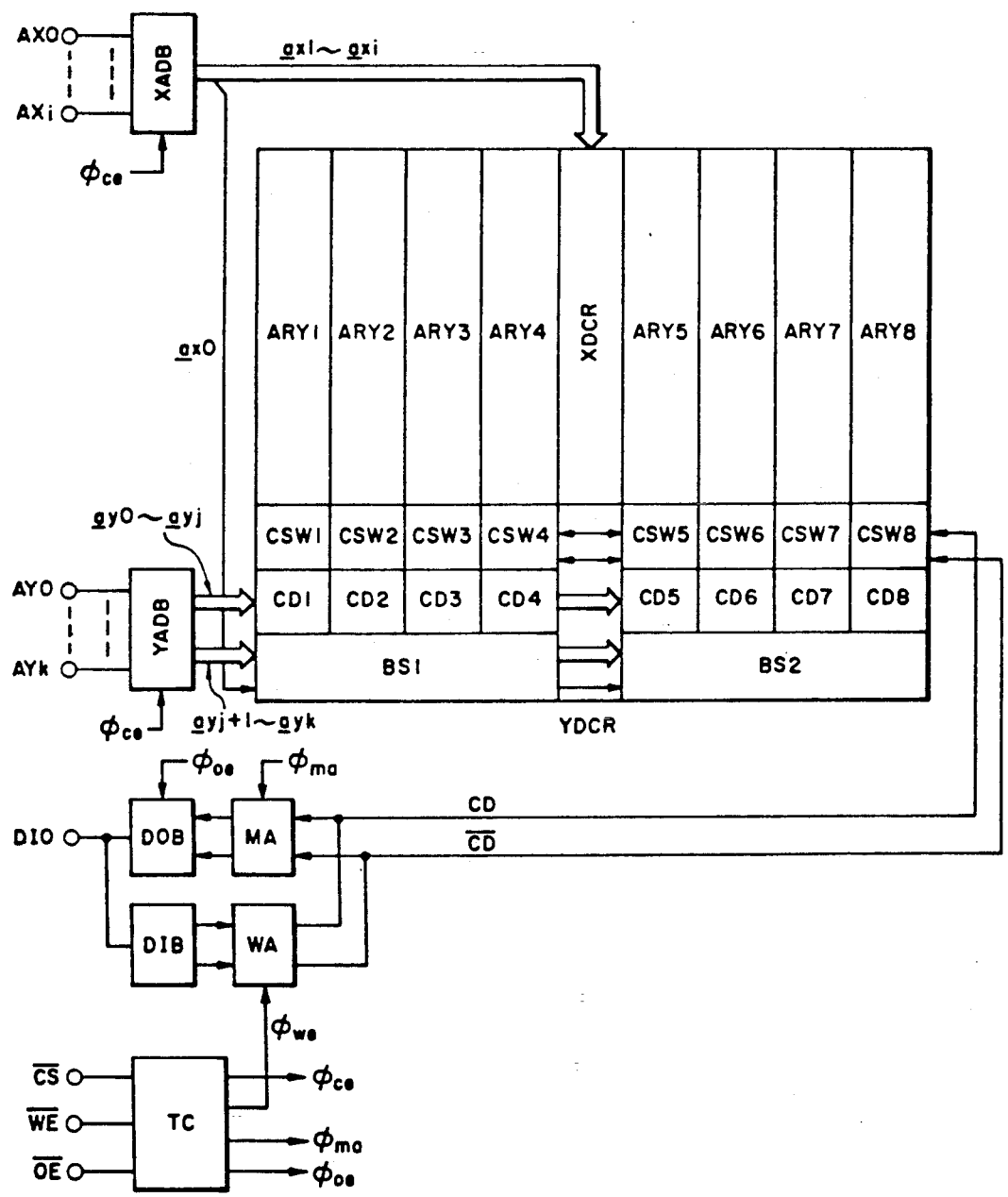
FIG. 12 is a block diagram showing an embodiment of the bipolar CMOS RAM incorporating memory arrays and peripheral circuits shown in FIG. 5.
Figure 13:
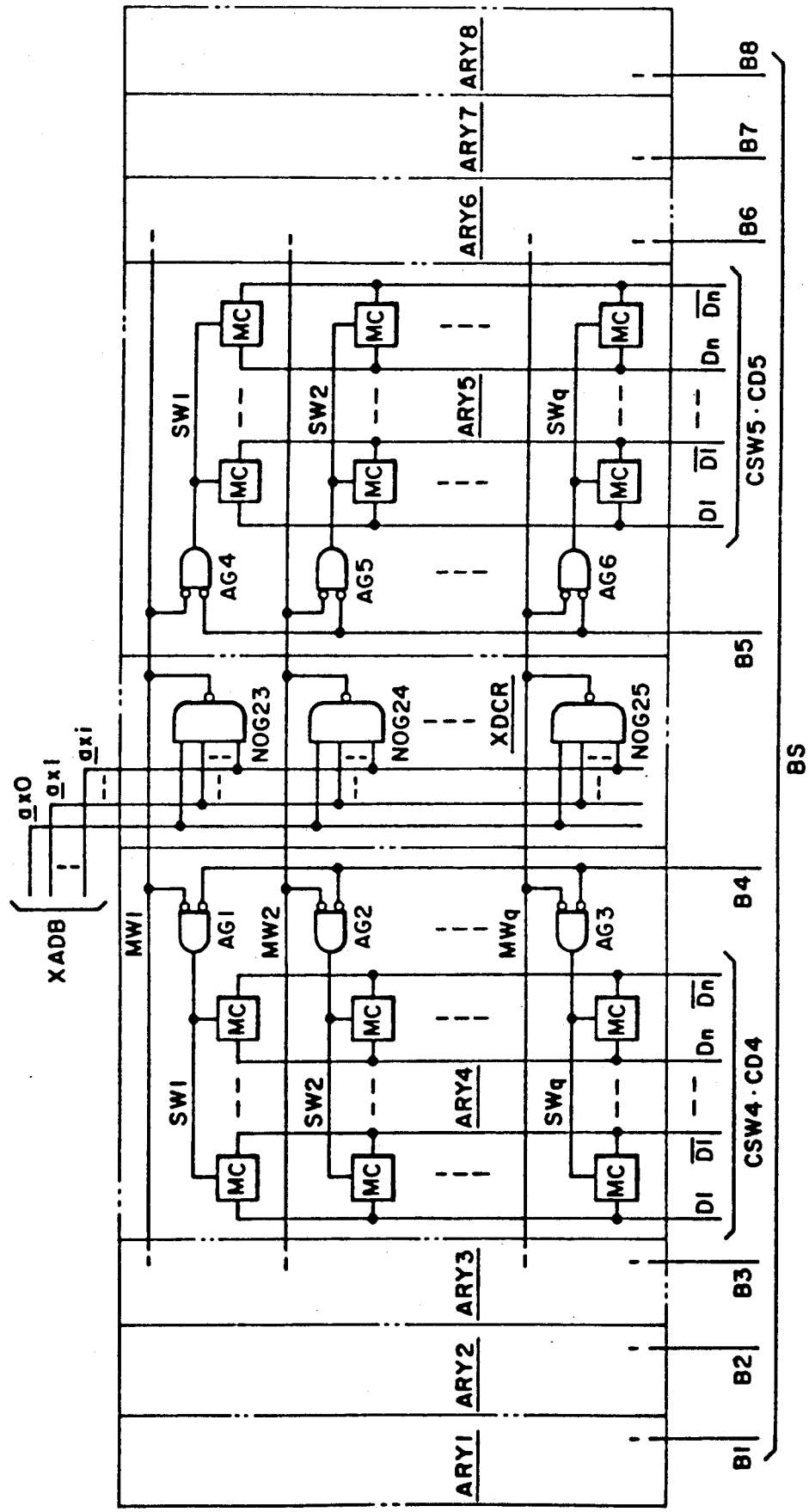
FIG. 13 is a schematic diagram showing an example of memory arrays and peripheral circuits in a conventional bipolar CMOS RAM.

FIG. 12 shows in block diagram another embodiment of bipolar CMOS RAM to which the present invention is applied. This RAM is virtually the same as the preceding one shown in FIG. 11, and their differences will be described in the following. The bipolar CMOS RAM of this embodiment is not provided with the mat selection circuit as opposed to the one shown in FIG. 11. Accordingly, the complementary mat select signals are not supplied to the X address decoder XDCR, which otherwise receives only the complementary internal address signals ax1-axi from the X address buffer XADB. The resulting effects attributable to this difference will be described in connection with FIG. 5.

Figure 5:
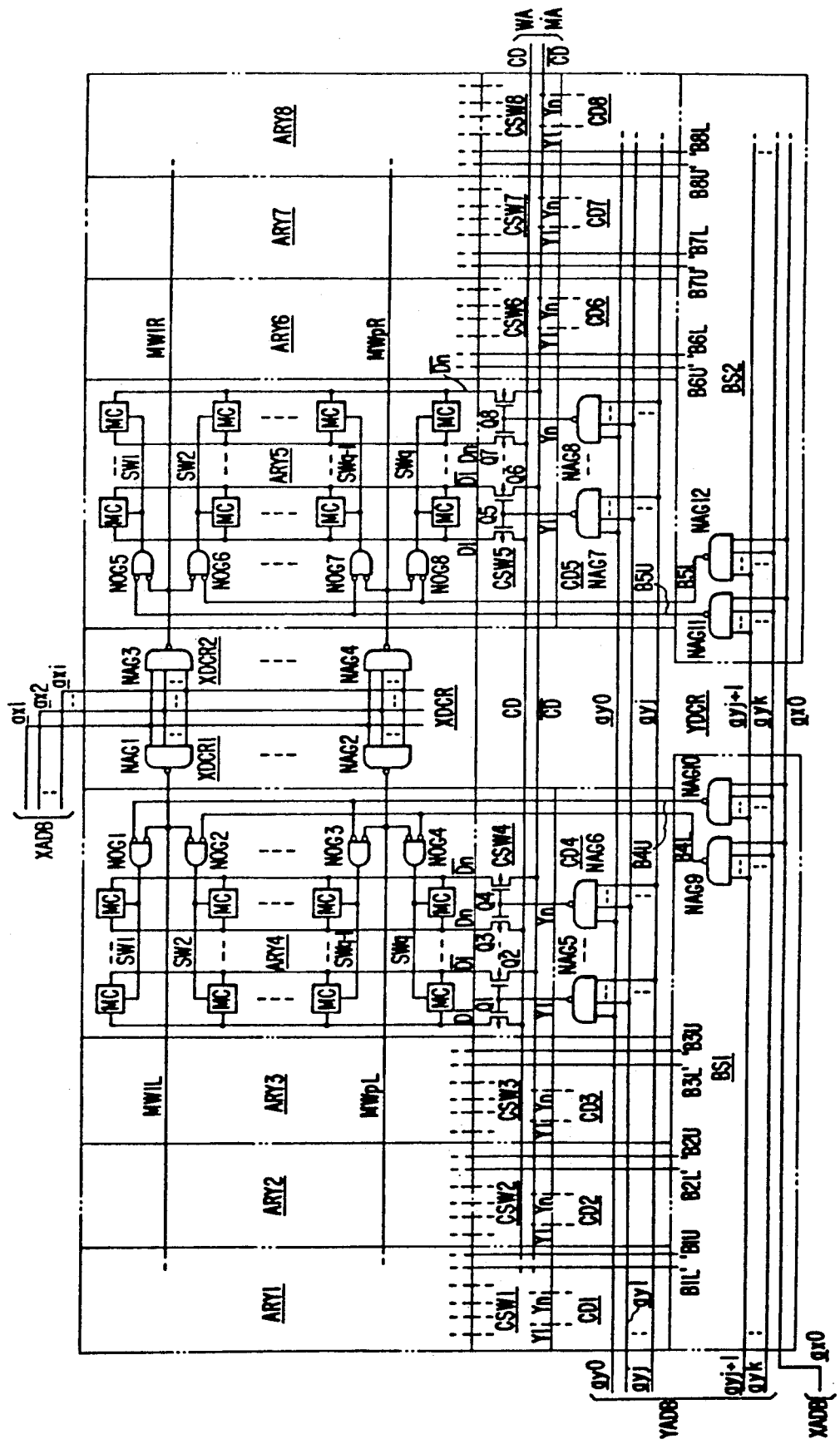
FIG. 5 is a schematic diagram showing the fifth embodiment of the memory array and peripheral circuit of the bipolar CMOS RAM to which the present invention is applied.

FIG. 5 shows a specific embodiment of the RAM shown in FIG. 12. The following are the differences of this RAM from the virtually same one shown in FIG. 1. In this embodiment, the X address decoder XDCR1 includes decoding NAND gates NAG1-NAG2 in correspondence to the combinations of the complementary internal address signals ax1-axi, and similarly the X address decoder XDCR2 includes decoding NAND gates NAG3-NAG4 in correspondence to the complementary internal address signals ax1-axi. On this account, the NAND gates supplied with the same address signals have their input terminals connected together. In consequence, in word line selection, a main word line for the divisional memory arrays ARY1-ARY4 and a main word line for the divisional memory array ARY5-ARY8 are selected, one main word line for each divisional memory array.

Selection of sub word lines is implemented by the sub word line selection circuit in the same way as the embodiment of FIG. 1. Among sub word line selection circuits connected to the selected main word line, a sub word line selection circuit selected by the block select signal selects one of two sub word lines, and consequently the memory cell MC connected to the selected sub word line is selected. This embodiment does not necessitate the mat selection circuit, whereby the chip area can be reduced.

Although in the foregoing embodiments the X address decoder XDCR is divided into two decoders XDCR1 and XDCR2, with the row select signals (main word lines) being divided accordingly, and two divided word lines (sub word lines) are laid above and below each row select signal line, these measures may be taken separately as shown in FIGS. 2, 3, 6 and 7.

Figure 2:
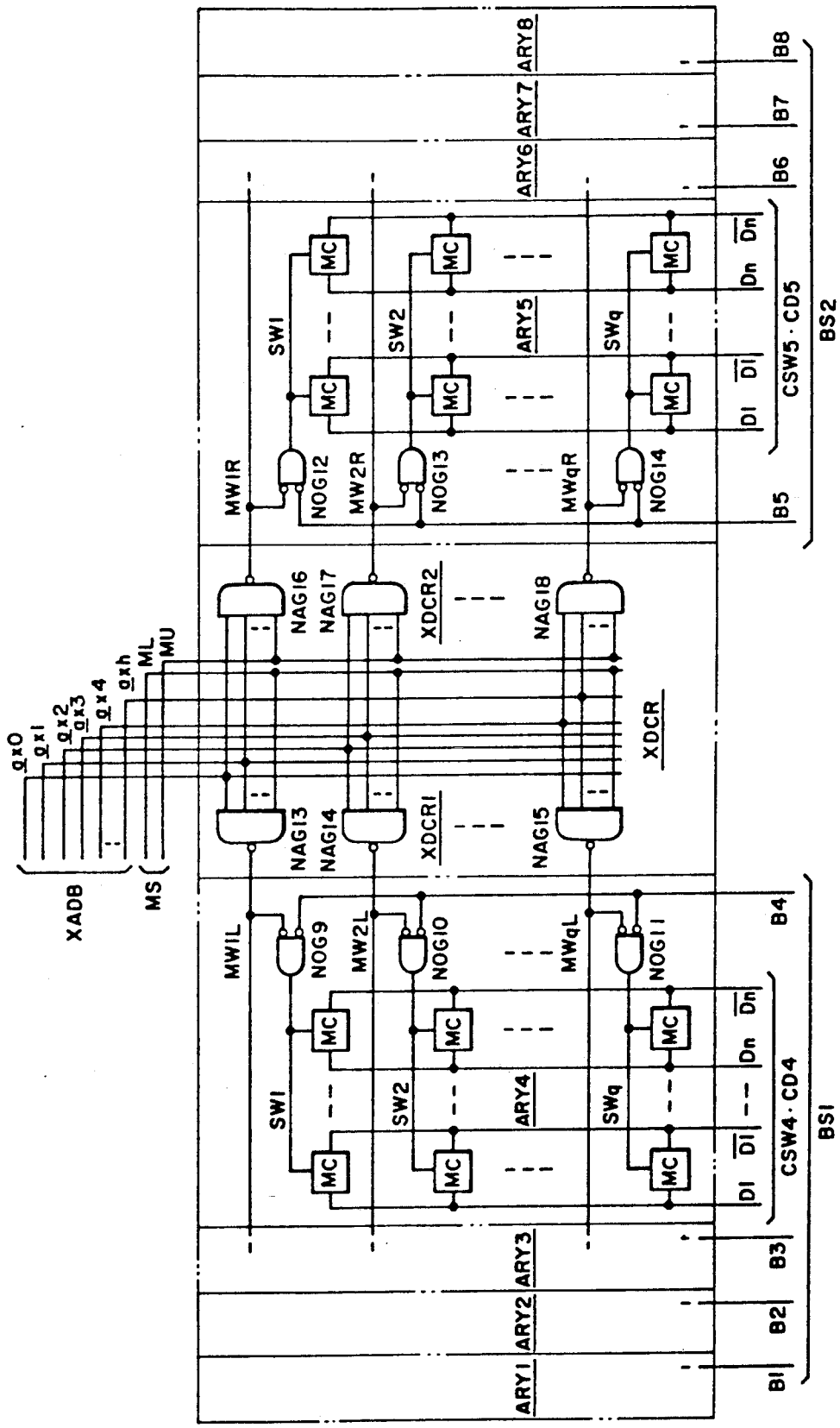
FIG. 2 is a schematic diagram showing the second embodiment of the memory array and peripheral circuit of a bipolar CMOS RAM to which the present invention is applied.

In the embodiment of FIG. 2, decoding NAND gates NAG13-NAG18 in correspondence to the combinations of the complementary internal address signals ax0-axh and mat select signals $\overline{ML}$ and $\overline{MU}$ are provided in the X address decoder XDCR. The memory array is divided into a set of divisional memory arrays ARY1-ARY4 and a set of divisional memory arrays ARY5-ARY8. The main word lines are each divided into two. However, different from the preceding embodiment, each main word line is provided in one-to-one correspondence to the sub word lines SW1-SWq of the divisional memory arrays ARY1-ARY8. Namely, in each divisional memory array, one sub word line is provided for one main word line in this embodiment. The common complementary data lines CD·$\overline{CD}$, although they are not shown, are used commonly for the divisional memory arrays ARY1-ARY8 as in the embodiment shown in FIG. 1. Dividing the main word lines into two reduces the distributed resistance and load capacitance, whereby the word line selecting operation can be sped up.

Figure 3:
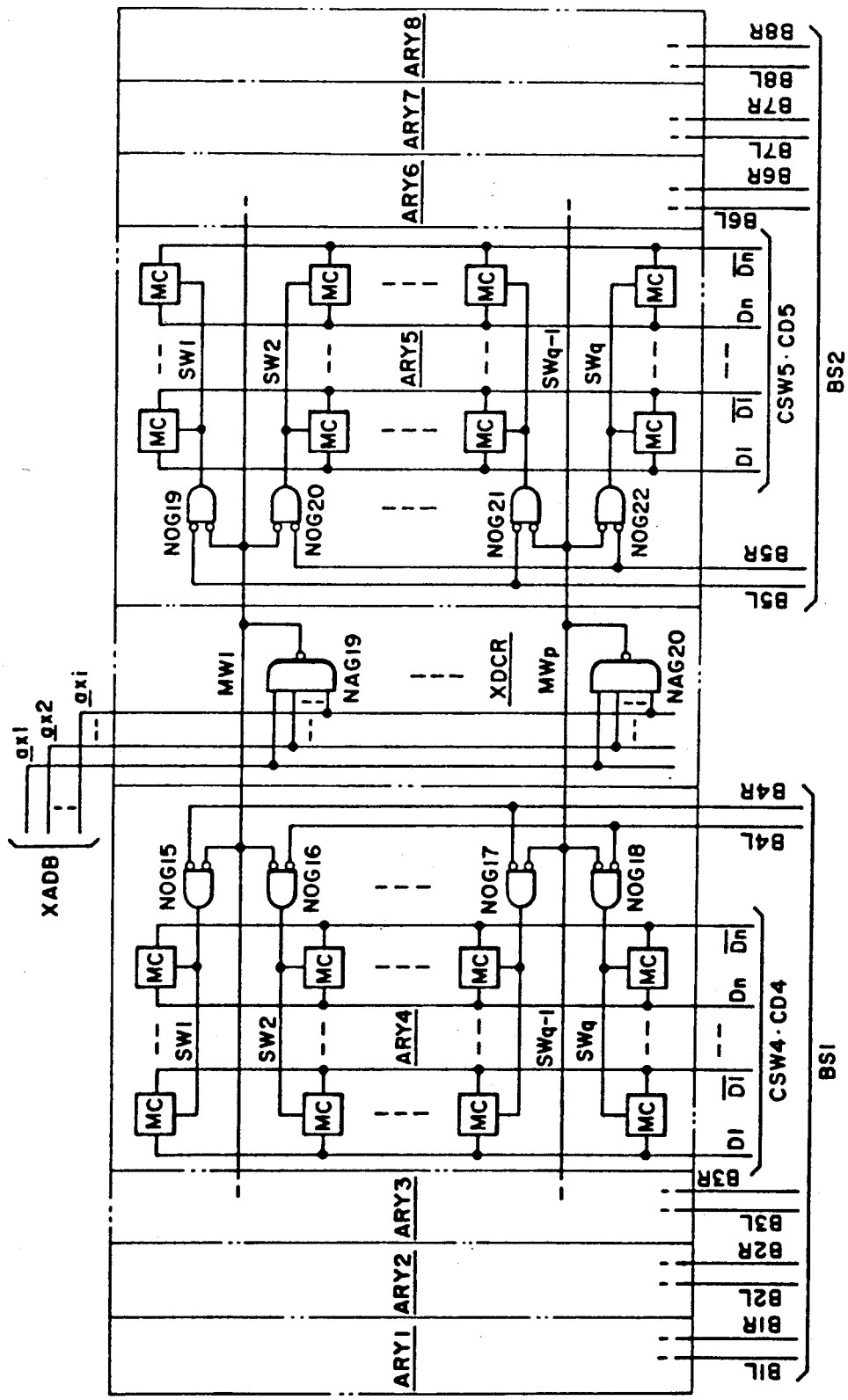
FIG. 3 is a schematic diagram showing the third embodiment of the memory array and peripheral circuit of the bipolar CMOS RAM to which the present invention is applied.

In the embodiment of FIG. 3, NOR gates NOG15-NOG16 through NOG21·NOG22 are provided for the main word lines, and are connected to any of two divided word lines through the NOR gates NOG15-NOG16. The X address decoder XDCR is provided with decoding NAND gates NAG19-NAG20 in correspondence to each combination of complementary internal address signals ax1-axi, and the main word lines MW1-MWp are not divided into two. Therefore, the distributed resistance and load capacitance of the main word lines are not much reduced, but the correspondence of each main word line to each pair of divided word lines enhances the latitude of layout, which allows increased dimensions of the decoding NAND gates in the X address decoder XDCR, and consequently the enhanced driving ability is useful for speeding up the word line selecting operation.

Particularly in this embodiment, the NAND gate NAG1 shown in FIG. 9 is used for each of the decoding NAND gates NAG19-NAG20, and this allows the bipolar transistors to drive the main word lines at a high speed, thereby further improving the operating speed. Moreover use of the NOR gate NOG2 shown in FIG. 9 for the NOR gates NOG15, NOG16, etc. enables the chip area to be used efficiently.

Figure 6:
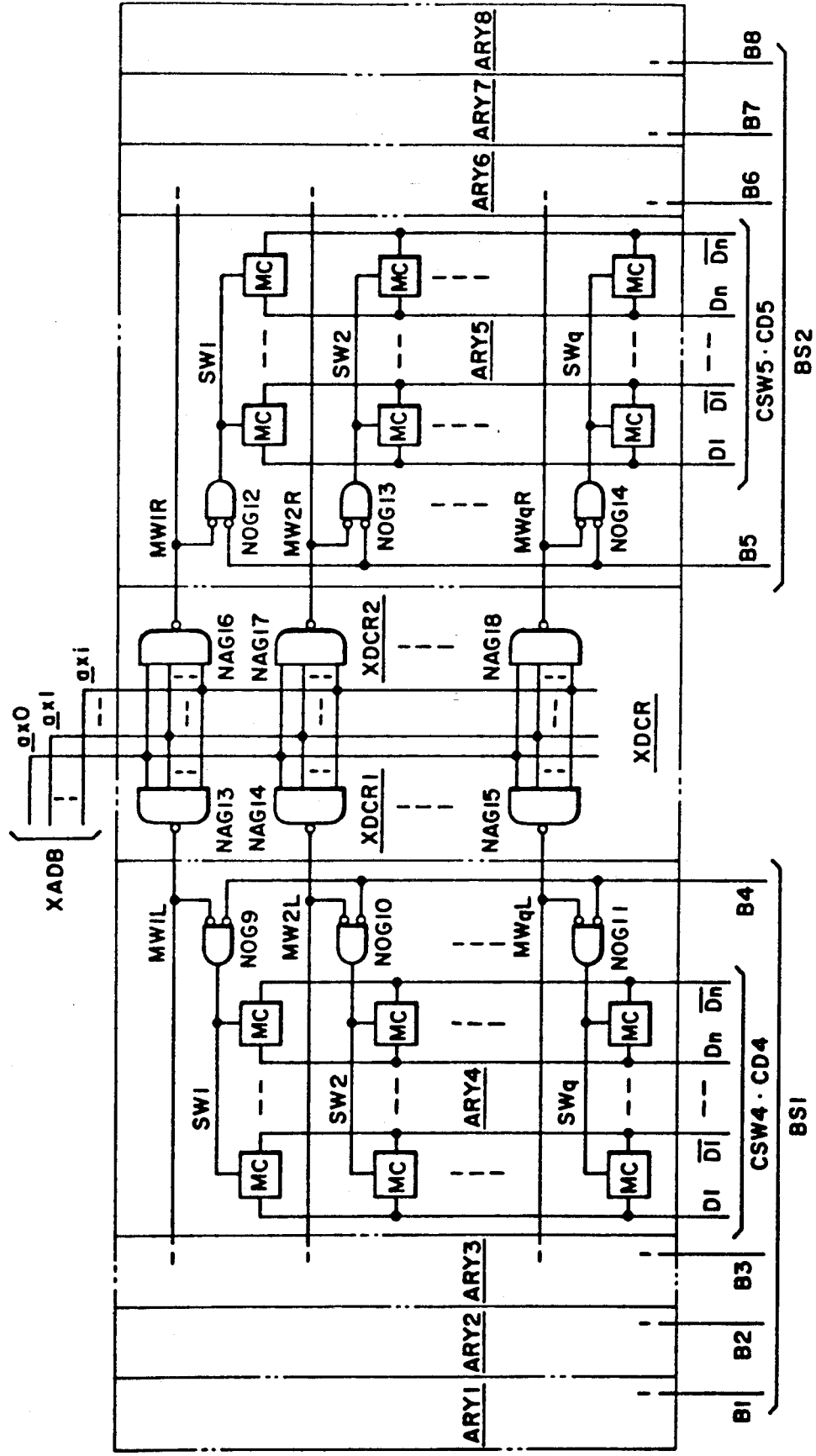
FIG. 6 is a schematic diagram showing the sixth embodiment of the memory array and peripheral circuit of the bipolar CMOS RAM to which the present invention is applied.

In the embodiment of FIG. 6, the X address decoder XDCR1 is provided with unit decoders NAG1-3-NAG15 in correspondence to the combinations of the complementary internal address signals ax0-axi, and the X address decoder XDCR2 is provided with unit decoders NAG16-NAG18 similar to the NAG1-3-NAG15. The main word lines are divided into two accordingly. Each main word line is arranged in one-to-one correspondence to the sub word lines SW1-SWq of divisional memory arrays ARY1-ARY8. Also in this embodiment, the common complementary data lines CD·$\overline{CD}$ (not shown) are used commonly for the divisional memory arrays ARY1-ARY8. Namely, the complementary data lines CD·$\overline{CD}$ are connected through the column switch to the divisional memory arrays. Although in this embodiment, the decoding NAND gates of the X address decoder XDCR have a restricted layout, the main word lines have a reduced distributed resistance and load capacitance by being divided into two, whereby the speed-up of word line selection is accomplished. Also in this embodiment, the NAND gates NAG1 shown in FIG. 9 is used for the unit decoders NAG13-NAG18, and fast word line selection is accomplished.

Figure 7:
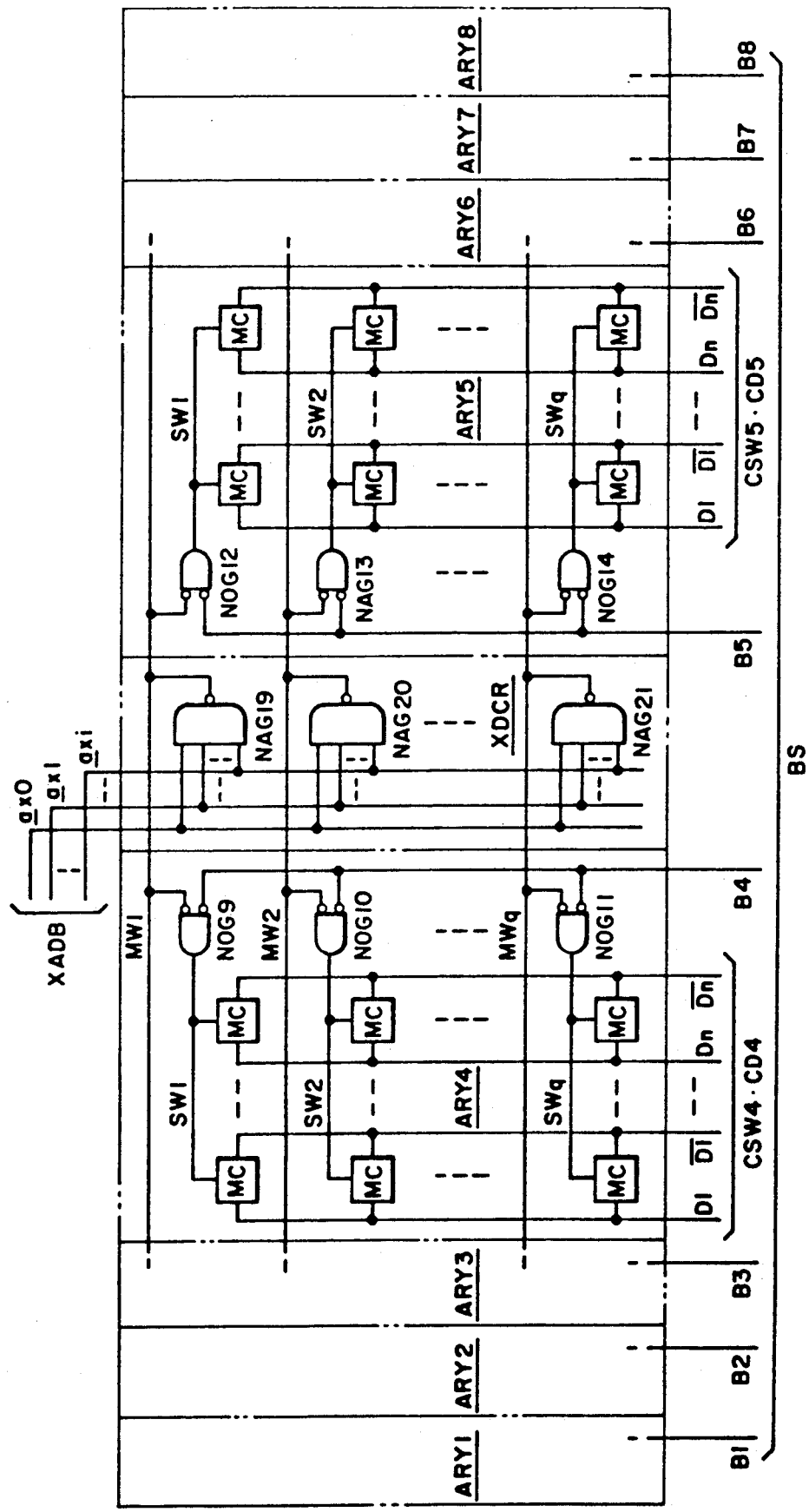
FIG. 7 is a schematic diagram showing the seventh embodiment of the memory array and peripheral circuit of the bipolar CMOS RAM to which the present invention is applied.

In the embodiment of FIG. 7, the X address decoder XDCR is provided with unit decoders NAG1-9-NAG21 for respective combinations of the complementary internal address signals ax0-axi, and the main word lines MW1-MWp are not divided into two. Each main word line is arranged in one-to-one correspondence to the sub word lines SW1-SWq of divisional memory arrays ARY1-ARY8.

In this embodiment, unit decoders constituting the X address decoder XDCR are formed of the NAND gate NAG1 shown in FIG. 9, and word line selection is sped up.

FIG. 8 is a schematic diagram showing a specific embodiment of the memory cell used in the bipolar CMOS RAM. The basic circuit arrangement includes two sets of inverters made up of n-channel MOS FETs Q39-Q40 and high load resistors R1-R2, although no limitation is intended. These inverters have their input and output terminals cross-connected so as to configure flip-flops serving as memory elements of the bipolar CMOS RAM. A pair of input-output nodes of this flip-flop are connected through transfer gate n-channel MOS FETs Q37-Q38 to the corresponding complementary data lines D1·$\overline{D1}$ with the gates of Q37-Q38 being connected to the sub word line SW or the main word line.

As shown by the foregoing embodiments, the application of this invention to a bipolar CMOS RAM provides the following effectiveness.

(1) The row-select decoding logic gates or drivers are provided in correspondence to the combinations of address signals (including mat select signals), the row select signal lines (main word lines) are laid on both sides of the X address decoder, for example, and connected to the corresponding logic gates or drivers, thereby dividing the length of the row select signal lines, and consequently the distributed resistance and load capacitance are reduced.

(2) The row select signal lines are arranged in correspondence to divided word lines laid in parallel above and below each row select signal line in each divisional memory array and connected selectively to the row select signal line in accordance with the block select signal, thereby increasing the latitude of layout for the row-select decoding logic gates, which allows increased dimensions for the decoding logic gates, for example, and resulting increased driving ability.

(3) By exerting the above items (1) and (2) in unison, the word line selecting operation of a semiconductor memory device such as a bipolar CMOS RAM employing the word line division system is further sped up, and the access time can be reduced.

Although the invention has been described based on the specific embodiments, it is not confined to these embodiments, but various changes are of course possible without departing from the substance of the invention. For example, in the embodiment of FIG. 1, the number of divisions of the memory array does not have to be eight, and three or more divided word lines may be arranged in correspondence to each main word line. Although in the embodiments of FIGS. 5 and 6 the decoding NAND gates of X address decoder XDCR are designed to drive the main word lines and provided in pair in correspondence to the right and left main word lines, the decoding logic gates and drivers may be separated and only the drivers may be provided in pairs in correspondence to the main word lines. The X address decoder XDCR and Y address decoder YDCR may be a predecoding system, and various combinations are possible for each decoding logic gate. The complementary common data lines CD·$\overline{CD}$ may be provided separately for write lines and read lines, and each divisional memory array may be provided with a reading preamplifier. The memory array of FIG. 1 may be formed of a plurality of memory arrays made up of a plurality of divisional memory arrays. Furthermore, various forms of practice are possible for the arrangement of the bipolar CMOS RAM shown in FIG. 11, for the specific circuit arrangement of memory array of FIG. 1, and for the combination of control signals and address signals.

Although the foregoing description has been concentrated on the application of the present invention to the bipolar-CMOS static RAM, which is a background utilization field of the invention, the present invention is not confined to this case, but it is applicable to other various semiconductor memory devices, e.g., dynamic RAMs. The invention is applicable to extensive semiconductor memory devices which at least adopt the word line division system.

What is claimed is:

1. A semiconductor memory device comprising:
    a plurality of memory cell array blocks arranged in a row;
    a plurality of first lines disposed on the memory cell array blocks; and
    a first selection means comprised of p-channel MOS FETs, n-channel MOS FETs and bipolar transistors for selecting one of the first lines in accordance with first selection signals,
    each memory cell array block further including:
        a plurality of second lines disposed in parallel with the first lines on the memory cell array block, wherein each of the second lines is coupled to one of the first lines;
        a plurality of memory cells coupled to each of the second lines; and
        a plurality of second selection means coupled to the second lines, respectively, and each comprised of p-channel and n-channel MOS FETs, and a bipolar transistor, for selecting one of the plurality of second lines in accordance with second selection signals, wherein the selected second line is coupled through a corresponding one of the second selection means to one of the first lines which has been selected by the first selection means.

2. A semiconductor memory device according to claim 1, wherein the first selection means includes an address decoder having a plurality of unit decoder circuits coupled to the first lines, respectively, wherein each of the unit decoder circuits includes at least one of the bipolar transistors coupled to provide an output signal to the first line to which it is coupled.

3. A semiconductor memory device according to claim 1, wherein the unit decoder circuit includes at least two of the bipolar transistors serially coupled to one another.

4. A semiconductor memory device according to claim 1, wherein the memory cell includes a pair of inverter circuits having input terminals which are coupled to an output terminal of the other inverter circuit.

5. A semiconductor memory device according to claim 1, wherein the first selection means is disposed between the plurality of memory cell array blocks, and the plurality of first lines extends on both sides of the first selection means on the plurality of memory cell array blocks.

6. A semiconductor memory device comprising:
    a plurality of memory cell array blocks arranged in a row;
    a plurality of first lines disposed on said memory cell array blocks; and
    a first selection means comprised of p-channel MOSFETs, n-channel MOSFETs and a bipolar transistor for selecting one of said first lines in accordance with first selection signals,
    said each memory cell array block further including:
        a plurality of second lines disposed in parallel with said first lines on the memory cell array blocks, wherein each of said second lines is coupled to one of said first lines;
        a plurality of memory cells connected to each of said second lines;
        a plurality of second selection means connected to said second lines, respectively, and each comprised of p-channel MOSFETs, n-channel MOSFETs and a bipolar transistor, for selecting one of said second lines in accordance with a second selection signal, wherein said selected second line is coupled through a corresponding one of said first lines which has been selected by said first selection means.

7. A semiconductor memory device according to claim 6, wherein said first selection means is an address decoder including a plurality of unit decoder circuits connected to said first lines, respectively, wherein each of said unit decoder circuits includes a bipolar transistor coupled to provide an output signal to a first line it is coupled to.

8. A semiconductor memory device according to claim 7, wherein said second selection means has two input terminals and an output terminal.

9. A semiconductor memory device according to claim 7, wherein said decoder circuit includes serially connected bipolar transistors and said second line is connected to a connection point of said serially connected bipolar transistors.

10. A semiconductor memory device according to claim 9, wherein said second selection means has two input terminals and an output terminal.

11. A semiconductor memory device according to claim 10, wherein said memory cell comprises a pair of inverter circuits having input terminals which are connected to an output terminal of the other inverter circuit.

12. A semiconductor memory device according to claim 6, wherein said first selection means is disposed between said plurality of memory cell array blocks, and said plurality of first lines extend on both sides of the first selection means on said plurality of memory cell array blocks.

13. A semiconductor memory device according to claim 6, wherein said each memory cell array block further comprises:
    a plurality of third lines disposed in parallel with said first lines on the memory cell array block with memory cells connected to the third line, wherein each of said third lines is coupled to one of said first lines; and
    a plurality of third selection means respectively coupled to said third lines and each formed of p-channel MOSFETs, n-channel MOSFETs and a bipolar transistor, for selecting one of said third lines coupled to the third selection means, in accordance with a third selection signal, whereby said first line selected by said first selection means is selectively coupled to one of the second lines through the second selection means or to one of the third lines through the third selection means in accordance with said second or third selection signal.

14. A semiconductor memory device according to claim 13, wherein said second selection means and said third selection means have two input terminals and one output terminal and one of input terminals of the second selection means and one of input terminals of the third selection means are coupled to said first line in common and the other input terminal of the second selection means is coupled to receive said second selection signal, and the other input terminals of the third selection means is coupled to receive said third selection signal.

15. A semiconductor memory device according to claim 14, wherein said first selection means is an address decoder including a plurality of unit decoder circuits connected to said first lines, respectively, wherein each of said unit decoder circuits includes a bipolar transistor coupled to provide an output signal to said first line it is coupled to.

16. A semiconductor memory device according to claim 14, wherein each of said unit decoders circuit includes serially connected bipolar transistors, wherein said first line is connected to a connection point of said serially connected bipolar transistors.

17. A semiconductor memory device according to claim 16, wherein said memory cell comprises a pair of inverter circuits each having an input terminal which is connected to an output terminal of the other inverter circuit.

18. A semiconductor memory device comprising:
a first memory mat including a first plurality of memory cell array blocks and a first row selection line disposed on said first memory cell array blocks;
a first row selection circuit formed of a p-channel MOSFET, an n-channel MOSFET and a bipolar transistor, and coupled to said first row selection line, for selecting said first row selection line in accordance with first address signals;
a second memory mat including a second plurality of memory cell array blocks and a second row selection line disposed on said second memory cell array blocks;
a second row selection circuit formed of a p-channel MOSFET, an n-channel MOSFET and a bipolar transistor, and coupled to said second row selection line, for selecting said second row selection line in accordance with said first address signals; and
a mat selection circuit for selecting said first row selection circuit or said second row selection circuit to be activated in accordance with a second address signal,
said memory cell array blocks in said first memory mat and in said second memory mat each further including:
a first sub word line, a plurality of memory cells connected to said first sub word line and a first sub word line selection circuit comprised of an n-channel MOSFET, a p-channel MOSFET and a bipolar transistor, coupled to said first sub word line for selecting the first sub word line coupled to said first row selection line or said second row selection line selected by said mat selection circuit in accordance with a sub word line selection signal.

19. A semiconductor memory device according to claim 18, wherein said first selection circuit and said second selection circuit are address decoders each including a plurality of unit decoder circuits connected to said first row selection line or said second row selection line, respectively, wherein each of said unit decoder circuits includes a bipolar transistor coupled to provide an output signal to said first row selection line or said second row selection line it is coupled to.

20. A semiconductor memory device according to claim 19, wherein said decoder circuits includes serially connected bipolar transistors and said first row selection line of said second row selection line is connected to a connection point of said serially connected bipolar transistors.

21. A semiconductor memory device according to claim 20, wherein said first sub word line selection circuit has two input terminals and an output terminal.

22. A semiconductor memory device according to claim 21, wherein said memory cell comprises a pair of inverter circuits having input terminals which are connected to an output terminal of the other inverter circuit.

23. A semiconductor memory device according to claim 18, wherein said first row selection circuit and said second row selection circuit are disposed between said first memory mat and said second memory mat, and said first address signals are coupled to said first row selection circuit and to said second row selection circuit in common.

24. A semiconductor memory device according to claim 18, further comprising:
a block selection means for selecting one memory cell array block from said first memory mat and one memory cell array block from said second memory mat in accordance with third address signals and for transferring said sub word line selection signal to said first sub word line selection circuit on the selected memory cell array block.

25. A semiconductor memory device comprising:
a first memory mat including first memory cell array blocks and a first row selection line disposed on said first memory cell array blocks;
a first row selection circuit comprised of a p-channel MOSFET, an n-channel MOSFET and a bipolar transistor, and coupled to said first row selection line, for selecting said first row selection line in accordance with first address signals;
a second memory mat including a second plurality of memory cell array blocks and a second row selection line disposed on said second memory cell array blocks;
a second row selection circuit comprised of a p-channel MOSFET, an n-channel MOSFET and a bipolar transistor, and coupled to said second row selection line, for selecting said second row selection line in accordance with first address signals; and
a mat selection circuit for selecting said first row selection circuit or said second row selection circuit to be activated in accordance with a second address signal,
said each memory cell array block in the first memory mat further including:
a plurality of first sub word lines connected to a plurality of memory cells; and
a plurality of first sub word line selection circuits each comprised of a p-channel MOSFET, an n-channel MOSFET and a bipolar transistor, respectively coupled to said first sub word lines and to said first row selection line,
said each memory cell block in the second memory mat further including:
a plurality of second sub word lines connected to a plurality of memory cells; and
a plurality of second sub word line selection circuits, each comprised of a p-channel MOSFET and an n-channel MOSFET, but not a bipolar transistor, respectively coupled to said second sub word lines and to said second row selection line; and a block selection means for outputting a selection signal to said first sub word line selection circuits and to said second sub word line selection circuits in accordance with third address signals so that a predetermined one first sub word line selection circuit is capable of electrically connecting said first row selection line and said first sub word line coupled to the first sub word line selection circuit or a predetermined one second sub word line selection circuit is capable of electrically connecting said second row selection line and said first sub word line coupled to the second sub word line selection circuit.

26. A semiconductor memory device according to claim 25, wherein said first row selection circuit and said second row selection circuit include a bipolar transistor coupled to provide an output signal to a first word line it is coupled to.

27. A semiconductor memory device according to claim 25, wherein said first row selection circuit and said second row selection circuit include serially connected bipolar transistors and said second word line is connected to a connection point of said serially connected bipolar transistors.

28. A semiconductor memory device according to claim 27, wherein said first sub word line selection circuit and said second sub word line selection circuit have two input terminals and an output terminal.

29. A semiconductor memory device according to claim 28, wherein said memory cell comprises a pair of inverter circuits having input terminals which are connected to an output terminal of the other inverter circuit.

30. A semiconductor memory device according to claim 25, wherein each memory cell block in said first memory mat includes a plurality of third sub word lines connected to a plurality of memory cells and a plurality of third sub word line selection circuits respectively coupled to said third sub word lines and to said first row selection line, and wherein each memory cell block in said second memory mat further includes a plurality of fourth sub word lines connected to a plurality of fourth memory cells and a plurality of fourth sub word line selection circuits respectively coupled to said fourth sub word lines and to said second row selection line, wherein said block selection means includes means for outputting a selection signal to said third sub word line selection circuit and to said fourth sub word line selection circuit so that a predetermined one of said third sub word line selection circuits is capable of electrically connecting said first row selection line and said third sub word line coupled to said third sub word line selection circuit or a predetermined one of said fourth sub word line selection circuits is capable of electrically connected said second row selection line and said fourth sub word line coupled to said fourth sub word selection circuit.

31. A semiconductor memory device comprising:
a plurality of memory cell array blocks arranged in a row;
a plurality of first lines disposed on said memory cell array blocks; and
a first selection means comprised of a p-channel MOSFET, an n-channel MOSFET and a bipolar transistor for selection one of said first lines in accordance with first selection signals,
said each memory cell array block further including:
a plurality of second lines disposed in parallel with said first lines on the memory cell array block, wherein each of said second lines is coupled to one of said first lines;
a plurality of memory cells connected to each of said second lines; and
a plurality of second selection means connected to said second lines, respectively, and comprised of p-channel MOSFETs, n-channel MOSFETs and bipolar transistors, for selecting one of said second line in accordance with a second selection signal, wherein said selected second line is coupled through a corresponding one of said second selection means to one of said first lines which has been selected by said first selection means.

* * * * *